(12) United States Patent
Ooka et al.

(10) Patent No.: US 12,009,377 B2
(45) Date of Patent: Jun. 11, 2024

(54) SOLID-STATE IMAGING DEVICE AND ELECTRONIC APPARATUS FOR CURBING DETERIORATION OF PICTURE QUALITY

(71) Applicant: SONY SEMICONDUCTOR SOLUTIONS CORPORATION, Kanagawa (JP)

(72) Inventors: Yutaka Ooka, Kanagawa (JP); Taizo Takachi, Kanagawa (JP); Yuichi Yamamoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 373 days.

(21) Appl. No.: 17/430,469

(22) PCT Filed: Feb. 21, 2020

(86) PCT No.: PCT/JP2020/006966
§ 371 (c)(1),
(2) Date: Aug. 12, 2021

(87) PCT Pub. No.: WO2020/171191
PCT Pub. Date: Aug. 27, 2020

(65) Prior Publication Data
US 2022/0115427 A1    Apr. 14, 2022

(30) Foreign Application Priority Data
Feb. 21, 2019    (JP) ................. 2019-029911

(51) Int. Cl.
*H01L 27/146* (2006.01)
*G02B 3/00* (2006.01)
*H01L 23/544* (2006.01)

(52) U.S. Cl.
CPC ...... *H01L 27/14618* (2013.01); *H01L 23/544* (2013.01); *H01L 27/1462* (2013.01);
(Continued)

(58) Field of Classification Search
None
See application file for complete search history.

(56) References Cited

U.S. PATENT DOCUMENTS

2007/0019101 A1    1/2007   Minamio et al.
2007/0108578 A1    5/2007   Watanabe
(Continued)

FOREIGN PATENT DOCUMENTS

CN    1901212 A    1/2007
CN    1967853 A    5/2007
(Continued)

OTHER PUBLICATIONS

International Search Report and Written Opinion of PCT Application No. PCT/JP2020/006966, dated May 19, 2020, 09 pages of ISRWO.

*Primary Examiner* — Nduka E Ojeh
(74) *Attorney, Agent, or Firm* — CHIP LAW GROUP

(57) ABSTRACT

Picture quality deterioration is curbed. A solid-state imaging device according to an embodiment includes: a semiconductor substrate (131) including a light-receiving element; an on-chip lens (132) disposed on a first surface of the semiconductor substrate; a resin layer (133) covering the on-chip lens; and a glass substrate (134) disposed on the side of the first surface of the semiconductor substrate separately from the resin layer.

19 Claims, 53 Drawing Sheets

(52) U.S. Cl.
CPC .. *H01L 27/14623* (2013.01); *H01L 27/14627* (2013.01); *H01L 27/14683* (2013.01); *G02B 3/0056* (2013.01); *H01L 2223/54426* (2013.01)

(56) References Cited

U.S. PATENT DOCUMENTS

| | | | |
|---|---|---|---|
| 2010/0248453 A1 | 9/2010 | Watanabe | |
| 2010/0289100 A1 | 11/2010 | Otsuka et al. | |
| 2013/0032914 A1* | 2/2013 | Iwasaki | H01L 31/02327 |
| | | | 257/E31.127 |
| 2013/0235230 A1 | 9/2013 | Otsuka et al. | |
| 2017/0236860 A1 | 8/2017 | Yamamoto et al. | |
| 2017/0271389 A1 | 9/2017 | Yamamoto et al. | |
| 2018/0085859 A1* | 3/2018 | Yamazaki | G02F 1/136286 |
| 2018/0095559 A1* | 4/2018 | Yamazaki | G02F 1/133553 |
| 2018/0331142 A1 | 11/2018 | Yamamoto et al. | |

FOREIGN PATENT DOCUMENTS

| | | |
|---|---|---|
| CN | 101887901 A | 11/2010 |
| CN | 105793988 A | 7/2016 |
| CN | 105793989 A | 7/2016 |
| CN | 108336104 A | 7/2018 |
| CN | 110610951 A | 12/2019 |
| CN | 110649052 A | 1/2020 |
| CN | 110649053 A | 1/2020 |
| EP | 1786033 A2 | 5/2007 |
| EP | 3100303 A2 | 12/2016 |
| JP | 2004-207461 A | 7/2004 |
| JP | 2007-053337 A | 3/2007 |
| JP | 2007-141957 A | 6/2007 |
| JP | 2008-270650 A | 11/2008 |
| JP | 2010-267828 A | 11/2010 |
| JP | 2015-159275 A | 9/2015 |
| KR | 10-0681781 B1 | 2/2007 |
| KR | 10-2010-0123612 A | 11/2010 |
| KR | 10-2016-0113605 A | 9/2016 |
| TW | 200719443 A | 5/2007 |
| TW | 201106473 A1 | 2/2011 |
| TW | 201535699 A | 9/2015 |
| WO | 2015/111419 A2 | 7/2015 |

\* cited by examiner

SOLID-STATE IMAGING DEVICE AND ELECTRONIC APPARATUS FOR CURBING DETERIORATION OF PICTURE QUALITY

CROSS REFERENCE TO RELATED APPLICATIONS

This application is a U.S. National Phase of International Patent Application No. PCT/JP2020/006966 filed on Feb. 21, 2020, which claims priority benefit of Japanese Patent Application No. JP 2019-029911 filed in the Japan Patent Office on Feb. 21, 2019. Each of the above-referenced applications is hereby incorporated herein by reference in its entirety.

TECHNICAL FIELD

The present disclosure relates to a solid-state imaging device and an electronic apparatus.

BACKGROUND ART

Recently, in electronic apparatuses such as a mobile terminal device equipped with a camera and a digital still camera, the number of pixels of a camera has increased and the size and thickness of the camera have decreased. To decrease the size and thickness of a camera, a solid-state imaging device is configured as a chip size package (CSP) type, in general.

CITATION LIST

Patent Literature

[PTL 1]
  JP 2004-207461A
[PTL 2]
  JP 2008-270650A

SUMMARY

Technical Problem

However, when a solid-state imaging device is configured as a CSP type, a flare phenomenon occurs due to reflection and diffraction of light in the imaging device, and thus there are cases in which picture quality deteriorates.

Accordingly, the present disclosure proposes a solid-state imaging device and an electronic apparatus capable of curbing deterioration of picture quality.

Solution to Problem

To solve the aforementioned problems, a solid-state imaging device of one aspect according to the present disclosure includes: a semiconductor substrate including light-receiving elements; an on-chip lens disposed on a first surface of the semiconductor substrate; a resin layer that covers the on-chip lens; and a glass substrate disposed on the side of the first surface of the semiconductor substrate separately from the resin layer.

DESCRIPTION OF EMBODIMENTS

Figure 1:
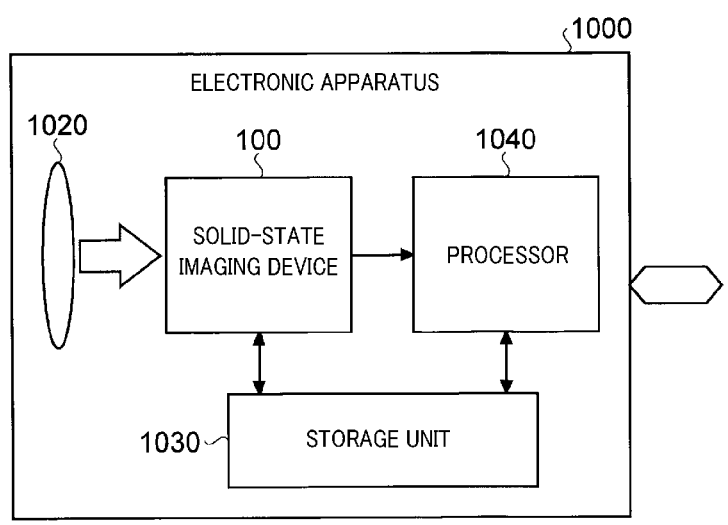
FIG. 1 is a block diagram showing a schematic configuration example of an electronic apparatus equipped with a solid-state imaging device according to a first embodiment.

Hereinafter, embodiments of the present disclosure will be described in detail on the basis of the drawings. Further, in the following embodiments, redundant description will be omitted by denoting the same parts by the same signs.

In addition, items of the present disclosure will be described in the following order.

1. First Embodiment
1.1 Example of configuration of electronic apparatus
1.2 Example of configuration of solid-state imaging device
1.3 Example of configuration of unit pixel
1.4 Example of basic function of unit pixel
1.5 Example of laminated structure of solid-state imaging device
1.6 Flare phenomenon
1.7 Example of cross-sectional structure
1.8 Manufacturing method
1.9 Operation and effects
1.10 Modified example
2. Second Embodiment
2.1 Example of cross-sectional structure
2.2 Manufacturing method
2.2.1 Modified example of manufacturing method
2.3 Lens function of resin layer
2.4 Pupil correction
2.5 Operation and effects
2.6 Modified examples of glass substrate
2.6.1 First modified example
2.6.2 Second modified example
2.6.3 Third modified example
2.6.4 Fourth modified example
3. Third Embodiment
3.1 Example of cross-sectional structure
3.2 Manufacturing method
3.3 Operation and effects
4. Fourth Embodiment
4.1 Example of cross-sectional structure
4.2 Manufacturing method
4.2.1 Modified example of manufacturing method
4.3 Operation and effects
5. Fifth Embodiment
5.1 Example of cross-sectional structure
5.2 Manufacturing method
5.3 Operation and effects
6. Sixth Embodiment
6.1 Example of cross-sectional structure 6.2 Manufacturing method
6.3 Operation and effects
7. Seventh Embodiment
7.1 Example of cross-sectional structure
7.2 Manufacturing method
7.3 Operation and effects
8. Eighth Embodiment
8.1 Example of cross-sectional structure
8.2 Operation and effects
9. Ninth Embodiment
9.1 Example of cross-sectional structure
9.2 Operation and effects
10. Modified examples of seventh to ninth embodiments
11. Application example 1 for moving object
12. Application example for endoscopic operation system 1. First Embodiment First, a solid-state imaging device and an electronic apparatus according to a first embodiment will be described in detail with reference to the drawings.

1.1 Example of Configuration of Electronic Apparatus

FIG. 1 is a block diagram showing a schematic configuration example of an electronic apparatus equipped with a solid-state imaging device according to the first embodiment. As shown in FIG. 1, the electronic apparatus 1000 includes, for example, an imaging lens 1020, a solid-state imaging device 100, a storage unit 1030, and a processor 1040.

The imaging lens 1020 is an example of an optical system that concentrates incident light and images the concentrated light on a light-receiving surface of the solid-state imaging device 100. The light-receiving surface may be a surface on which photoelectric conversion elements are arranged in the solid-state imaging device 100. The solid-state imaging device 100 photoelectrically converts incident light to generate image data. In addition, the solid-state imaging device 100 executes predetermined signal processing such as noise removal and white balance adjustment on the generated image data.

The storage unit 1030 includes, for example, a flash memory, a dynamic random access memory (DRAM), a static random access memory (SRAM), and the like and records image data and the like input from the solid-state imaging device 100.

The processor 1040 is configured, for example, using a central processing unit (CPU) or the like and may include an operating system, an application processor that executes various types of application software and the like, a graphics processing unit (GPU), a baseband processor, and the like. The processor 1040 executes various types of processing on image data input from the solid-state imaging device 100, image data read from the storage unit 1030, and the like, displays the image data and the like to a user, or transmits the image data and the like to the outside through a predetermined network.

1.2 Example of Configuration of Solid-State Imaging Device

Figure 2:
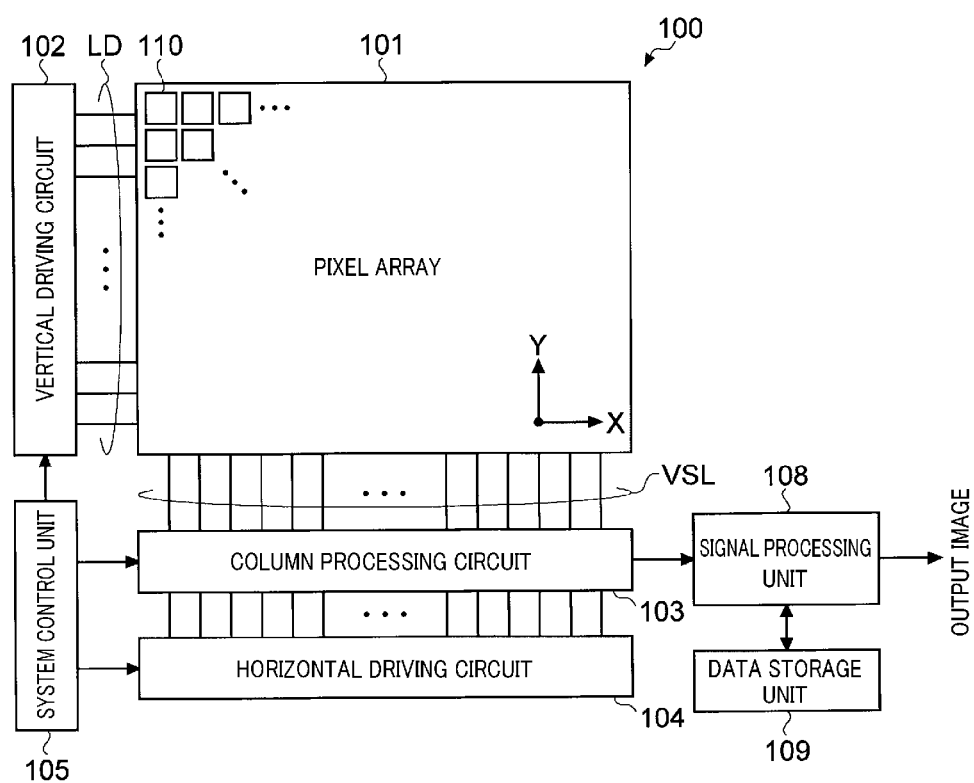
FIG. 2 is a block diagram showing a schematic configuration example of an image sensor according to the first embodiment.

FIG. 2 is a block diagram showing a schematic configuration example of a complementary metal-oxide-semiconductor (CMOS) type solid-state imaging device (hereinafter simply referred to as an image sensor) according to the first embodiment. Here, the CMOS type image sensor is an image sensor created by applying a CMOS process or partially using the CMOS process. The image sensor 100 according to the first embodiment may be a so-called back surface radiation type in which a surface of incidence is a surface on the side opposite an element formation surface in a semiconductor substrate (hereinafter referred to as a back surface) or may be a so-called a front surface radiation type in which the surface of incidence is the front surface.

As shown in FIG. 2, the image sensor 100 includes, for example, a pixel array 101, a vertical driving circuit 102, a column processing circuit 103, a horizontal driving circuit 104, a system control unit 105, a signal processing unit 108, and a data storage unit 109. In the following description, the vertical driving circuit 102, the column processing circuit 103, the horizontal driving circuit 104, the system control unit 105, the signal processing unit 108, and the data storage unit 109 are also called peripheral circuits.

The pixel array 101 has a configuration in which unit pixels (which may be simply described as "pixels" hereinafter) 110 including photoelectric conversion elements that generate and accumulate charge in response to the amount of received light are arranged in a row direction and a column direction, that is, in a two-dimensional lattice form in a matrix form (hereinafter referred to as a matrix form). Here, the row direction is an arrangement direction (a horizontal direction in the figure) of pixels in pixel rows, and the column direction is an arrangement direction (a vertical direction in the figure) of pixels in pixel columns. Details of a specific circuit configuration and a pixel structure of the unit pixels will be described later.

In the pixel array 101, a pixel drive line LD is wired in the row direction for each pixel row and a vertical signal line VSL is wired in the column direction for each pixel column for the pixel arrangement in the matrix form. The pixel drive line LD transmits a driving signal for performing driving when a signal is read from a pixel. Although the pixel drive lines LD are illustrated as individual wires in FIG. 2, they are not limited thereto. One end of each pixel drive line LD is connected to an output terminal corresponding to one row of the vertical driving circuit 102.

The vertical driving circuit 102 includes a shift register, an address decoder, and the like, and drives each pixel of the pixel array 101 simultaneously for all pixels or for each row. That is, the vertical driving circuit 102 constitutes a driving unit that controls the operation of each pixel of the pixel array 101 along with the system control unit 105 that controls the vertical driving circuit 102. Although illustration of a specific configuration of the vertical driving circuit 102 is omitted, it generally includes two scanning systems, a read scanning system and a sweep scanning system.

The read scanning system sequentially selects and scans the unit pixels in the pixel array 101 for each row in order to read signals from the unit pixels. The signals read from the unit pixels are analog signals. The sweep scanning system performs sweep scanning on read rows on which read scanning is performed by the read scanning system an exposure time in advance of the read scanning.

Unnecessary charge is swept from photoelectric conversion elements of unit pixels of the read rows through sweep scanning of the sweep scanning system, and thus the photoelectric conversion elements are reset. Then, the sweep scanning system sweeps (resets) the unnecessary charge so that a so-called electronic shutter operation is performed. Here, the electronic shutter operation is an operation of discarding charge of photoelectric conversion elements and newly starting exposure (starting accumulation of charge).

A signal read by a read operation using the read scanning system corresponds to the amount of light received after an immediately previous read operation or an electronic shutter operation. In addition, a period from a read timing in the immediately previous read operation or a sweep timing in the electronic shutter operation to a read timing in a current read operation is a charge accumulation period (also referred to as an exposure period) in the unit pixel.

A signal output from each unit pixel in a pixel row selectively scanned by the vertical driving circuit 102 is input to the column processing circuit 103 through each vertical signal line VSL for each pixel column. The column processing circuit 103 performs, for each pixel column of the pixel array 101, predetermined signal processing on a signal output from each pixel in a selected row through the vertical signal line VSL and temporarily holds the pixel signal after the signal processing.

Specifically, the column processing circuit 103 performs, as the signal processing, at least noise removal processing, for example, correlated double sampling (CDS) processing and double data sampling (DDS) processing. For example, reset noise and pixel-specific fixed pattern noise such as a variation in a threshold value of amplification transistors in pixels are removed through CDS processing. In addition, the column processing circuit 103 includes, for example, an analog-digital (AD) conversion function, converts an analog pixel signal read and obtained from a photoelectric conversion element into a digital signal, and outputs the digital signal.

The horizontal driving circuit 104 includes a shift register, an address decoder, and the like and sequentially selects read circuits (hereinafter referred to as pixel circuits) corresponding to the pixel columns of the column processing circuit 103. By this selective scanning performed by the horizontal driving circuit 104, pixel signals processed by the column processing circuit 103 for each pixel circuit are sequentially output.

The system control unit 105 includes a timing generator for generating various timing signals and the like and performs drive control of the vertical driving circuit 102, the column processing circuit 103, the horizontal driving circuit 104, and the like on the basis of various timing signals generated by the timing generator.

The signal processing unit 108 has at least an arithmetic operation processing function and performs various types of signal processing such as arithmetic operation processing on the pixel signals output from the column processing circuit 103. The data storage unit 109 temporarily stores data necessary for signal processing in the signal processing unit 108.

Further, image data output from the signal processing unit 108 may, for example, undergo predetermined processing executed in the processor 1040 of the electronic apparatus 1000 equipped with the image sensor 100 and the like or transmitted to the outside through a predetermined network.

1.3 Example of Configuration of Unit Pixel

Figure 3:
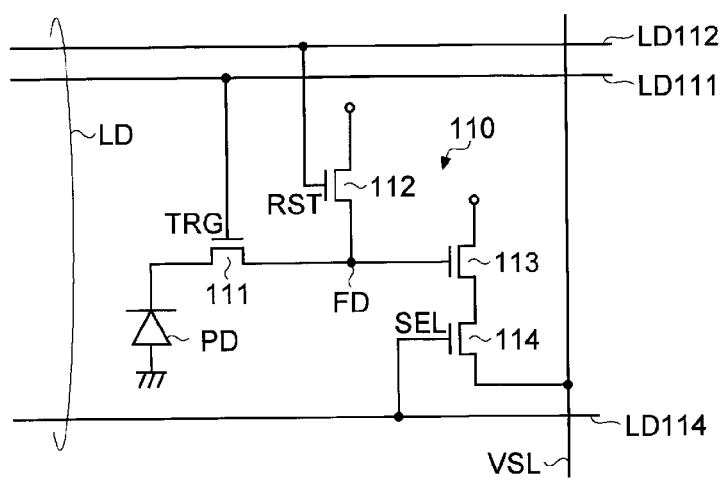
FIG. 3 is a circuit diagram showing a schematic configuration example of a unit pixel according to the first embodiment.

FIG. 3 is a circuit diagram showing a schematic configuration example of the unit pixel according to the first embodiment. As shown in FIG. 3, the unit pixel 110 includes a photodiode PD, a transfer transistor 111, a reset transistor 112, an amplification transistor 113, a select transistor 114, and a floating diffusion layer FD.

A select transistor drive line LD114 included in the pixel drive lines LD is connected to the gate of the select transistor 114, a reset transistor drive line LD112 included in the pixel drive lines LD is connected to the gate of the reset transistor 112, and a transfer transistor drive line LD111 included in the pixel drive lines LD is connected to the gate of the transfer transistor 111. In addition, the vertical signal line VSL connected to the column processing circuit 103 through one end thereof is connected to the drain of the amplification transistor 113 through the select transistor 114.

In the following description, the reset transistor 112, the amplification transistor 113, and the select transistor 114 are also collectively called a pixel circuit. This pixel circuit may include the floating diffusion layer FD and/or the transfer transistor 111.

The photodiode PD performs photoelectric conversion of incident light. The transfer transistor 111 transfers charge generated in the photodiode PD. The floating diffusion layer FD accumulates the charge transferred from the transfer transistor 111. The amplification transistor 113 causes a pixel signal having a voltage value corresponding to the charge accumulated in the floating diffusion layer FD to appear on the vertical signal line VSL. The reset transistor 112 discharges the charge accumulated in the floating diffusion layer FD. The select transistor 114 selects the unit pixel 110 that is a read target.

The anode of the photodiode PD is grounded and the cathode thereof is connected to the source of the transfer transistor 111. The drain of the transfer transistor 111 is connected to the source of the reset transistor 112 and the gate of the amplification transistor 113, and a node that is a connection point thereof constitutes the floating diffusion layer FD. Further, the drain of the reset transistor 112 is connected to a vertical reset input line that is not illustrated.

The source of the amplification transistor 113 is connected to a vertical current supply line that is not illustrated. The drain of the amplification transistor 113 is connected to the source of the select transistor 114, and the drain of the select transistor 114 is connected to the vertical signal line VSL.

The floating diffusion layer FD converts accumulated charge into a voltage having a voltage value corresponding to the amount of charge. Further, the floating diffusion layer FD may be capacitance to the ground, for example. However, the floating diffusion layer FD is not limited thereto and may be capacitance added by intentionally connecting a capacitor or the like to the node to which the drain of the transfer transistor 111, the source of the reset transistor 112, and the gate of the amplification transistor 113 are connected.

1.4 Example of Basic Function of Unit Pixel

Next, the basic function of the unit pixel 110 will be described with reference to FIG. 3. The reset transistor 112 controls discharge (reset) of charge accumulated in the floating diffusion layer FD according to a reset signal RST supplied from the vertical driving circuit 102 through the reset transistor drive line LD112. Further, it is also possible to discharge (reset) charge accumulated in the photodiode PD in addition to the charge accumulated in the floating diffusion layer FD by switching the transfer transistor 111 to an on state when the reset transistor 112 is in an on state.

When a reset signal RST at a high level is input to the gate of the reset transistor 112, the floating diffusion layer FD is clamped to a voltage applied through the vertical reset input line. Accordingly, the charge accumulated in the floating diffusion layer FD is discharged (reset).

In addition, when a reset signal RST at a low level is input to the gate of the reset transistor 112, the floating diffusion layer FD is electrically cut off from the vertical reset input line and enters a floating state.

The photodiode PD performs photoelectric conversion of incident light and generates charge corresponding to the amount of light. The generated charge is accumulated on the side of the cathode of the photodiode PD. The transfer transistor 111 controls transfer of charge from the photodiode PD to the floating diffusion layer FD according to a transfer control signal TRG supplied from the vertical driving circuit 102 through the transfer transistor drive line LD111.

For example, when a transfer control signal TRG at a high level is input to the gate of the transfer transistor 111, charge accumulated in the photodiode PD is transferred to the floating diffusion layer FD. On the other hand, when a transfer control signal TRG at a low level is supplied to the gate of the transfer transistor 111, transfer of charge from the photodiode PD stops.

As described above, the floating diffusion layer FD has a function of converting the charge transferred from the photodiode PD through the transfer transistor 111 into a voltage having a voltage value corresponding to the amount of charge. Accordingly, in a floating state in which the reset transistor 112 is turned off, the electric potential of the floating diffusion layer FD is modulated in response to the amount of charge accumulated therein.

The amplification transistor 113 serves as an amplifier having variation in the electric potential of the floating diffusion layer FD connected to the gate thereof as an input signal, and an output voltage signal of the amplification transistor 113 appears as a pixel signal on the vertical signal line VSL through the select transistor 114.

The select transistor 114 controls appearance of a pixel signal on the vertical signal line VSL according to the amplification transistor 113 according to the select control signal SEL supplied from the vertical driving circuit 102 through the select transistor drive line LD114. For example, when a select control signal SEL at a high level is input to the gate of the select transistor 114, a pixel signal according to the amplification transistor 113 appears on the vertical signal line VSL. On the other hand, when a select control signal SEL at a low level is input to the gate of the select transistor 114, appearance of the pixel signal on the vertical signal line VSL stops. Accordingly, in the vertical signal line VSL to which a plurality of unit pixels 110 are connected, only the output of a selected unit pixel 110 can be extracted.

1.5 Example of Laminated Structure of Solid-State Imaging Device

Figure 4:
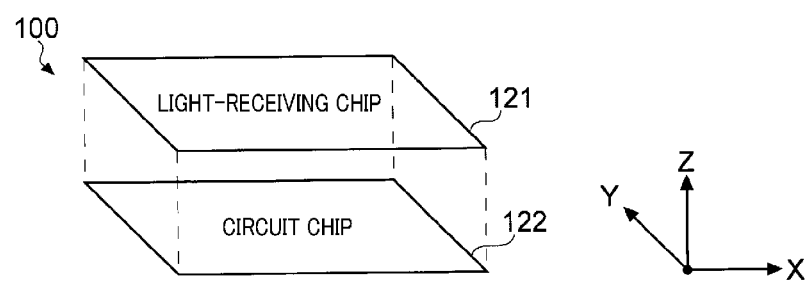
FIG. 4 is a diagram showing an example of a laminated structure of the image sensor according to the first embodiment.

FIG. 4 is a diagram showing an example of a laminated structure of the image sensor according to the first embodiment. As shown in FIG. 4, the image sensor 100 has a stack structure in which a light-receiving chip 121 and a circuit chip 122 are vertically laminated. The light-receiving chip 121 is, for example, a semiconductor chip including the pixel array 101 in which photodiodes PD are arranged, and the circuit chip 122 is, for example, a semiconductor chip including the pixel circuit shown in FIG. 3, the peripheral circuits in FIG. 2, and the like.

For bonding of the light-receiving chip 121 and the circuit chip 122, for example, so-called direct bonding of flattening bonding surfaces of the light-receiving chip 121 and the circuit chip 122 and attaching the chips to each other using interelectron force can be used. However, the bonding method is not limited thereto, and a so-called Cu—Cu bonding method of bonding electrode pads made of copper (Cu) formed on bonding surfaces, bump bonding, and the like may be used, for example.

In addition, the light-receiving chip 121 and the circuit chip 122 are electrically connected, for example, through a connection part such as a through-silicon via (TSV) penetrating the semiconductor substrate. For connection using a TSV, for example, a so-called twin TSV method of connecting two TSVs, a TSV provided in the light-receiving chip 121 and a TSV provided from the light-receiving chip 121 to the circuit chip 122, on the external surfaces of the chips, a so-called shared TSV method of connecting both chips using a TSV penetrating from the light-receiving chip 121 to the circuit chip 122, and the like can be employed.

However, when Cu—Cu bonding or bump bonding is used for bonding of the light-receiving chip 121 and the circuit chip 122, the chips are electrically connected through a Cu—Cu bonding part or a bump bonding part.

1.6 Flare Phenomenon

Figure 5:
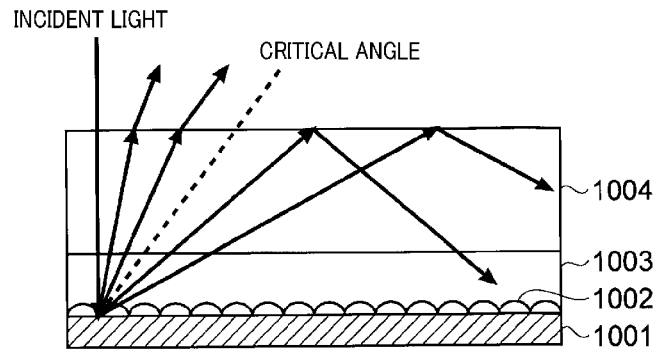
FIG. 5 is a cross-sectional view showing an example of a structure of a general CSP type solid-state imaging device.

Here, the flare phenomenon occurring in a general CSP type image sensor will be described. FIG. 5 is a cross-sectional view showing an example of a structure of a general CSP type solid-state imaging device. As shown in FIG. 5, the general CSP type solid-state imaging device has a structure in which a light-receiving surface of a semiconductor chip 1001 including light-receiving elements arranged in a matrix form and a glass substrate 1004 that protects the light-receiving surface of the semiconductor chip 1001 are attached to each other using an adhesive 1003 such as a resin.

Periodic structures such as on-chip lenses 1002 for respective pixels and wires for connecting circuit elements such as transistors in pixel circuits are present near the light-receiving surface of the semiconductor chip 1001.

When the periodic structures are present near the light-receiving surface of the semiconductor chip in this manner, light reflected by these periodic structures diffracts and high-order components in the diffracted light generated in this manner exceed a critical angle determined by refractive indexes of the glass substrate 1004 and the atmospheric air and are incident on the interface between the glass substrate 1004 and the atmospheric air. Accordingly, the components exceeding the critical angle are totally reflected from the upper surface of the glass substrate 1004 and are incident on the light-receiving surface again, and thus the flare phenomenon occurs.

Particularly, in the case of a so-called cavityless structure in which the adhesive 1003 such as a resin is filled between the glass substrate 1004 and the semiconductor chip 1001, as shown in FIG. 5, flare light according to diffracted light has high light intensity because even low-order diffracted light exceeds the critical angle, and thus a problem of considerable picture quality deterioration occurs.

Accordingly, the present embodiment includes the following configuration in order to curb picture quality deterioration caused by the flare phenomenon occurring due to total reflection of diffracted light.

1.7 Example of Cross-Sectional Structure

Figure 6:
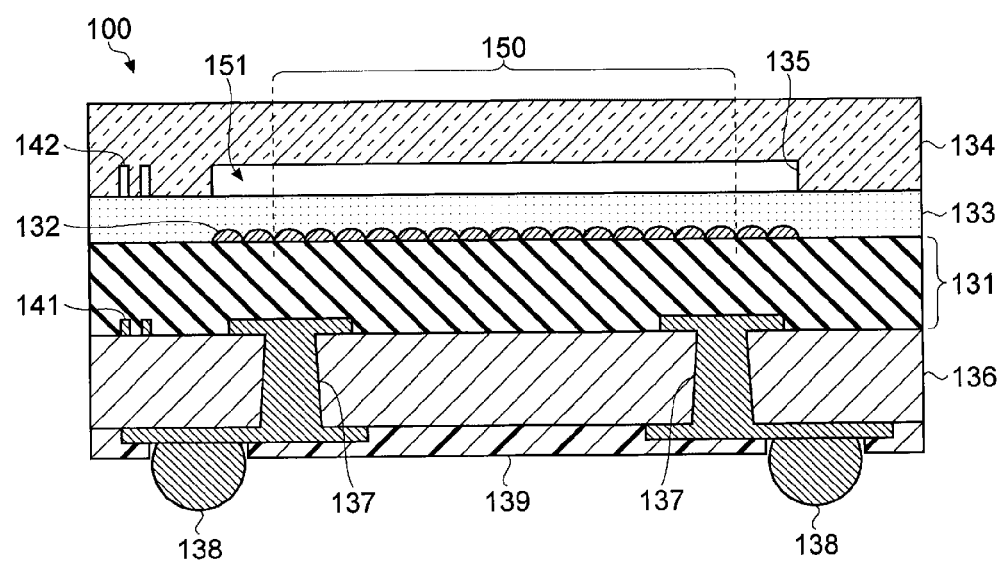
FIG. 6 is a cross-sectional view showing an example of a cross-sectional structure of the image sensor according to the first embodiment.

FIG. 6 is a cross-sectional view showing an example of a cross-sectional structure of the image sensor according to the first embodiment. Further, although a case in which the image sensor 100 is of the back surface radiation type is exemplified in the present description, the image sensor 100 may be of the front surface radiation type, as described above.

As shown in FIG. 6, the image sensor 100 includes a semiconductor substrate 131 on which photodiodes PD and the transfer transistors 111 in the plurality of unit pixels 110 are arranged in a matrix form, and a second semiconductor substrate 136 on which the remaining circuit elements of the unit pixels 110 (refer to FIG. 3) and the peripheral circuits (refer to FIG. 2) are provided. The photodiodes PD in the unit pixels 110 may be arranged, for example, in a matrix form on the back surface side of the semiconductor substrate 131. Further, the semiconductor substrate 131 may be, for example, the semiconductor substrate of the light-receiving chip 121 in FIG. 4, and the semiconductor substrate 136 may be, for example, the semiconductor substrate of the circuit chip 122 in FIG. 4.

A plurality of on-chip lenses 132, a glass substrate 134, and a resin layer 133 are provided on the back surface side (the upper surface side in the figure) of the semiconductor substrate 131. On the other hand, a passivation 139, lead electrodes 137, and ball bumps 138 are provided on the back surface side (the lower surface side in the figure) of the semiconductor substrate 136 attached to the front surface side (the lower surface side in the figure) of the semiconductor substrate 131.

Each on-chip lens 132 is provided for one photodiode PD arranged on the back surface side of the semiconductor substrate 131, for example. Accordingly, the on-chip lenses 132 are arranged in a matrix form on the back surface of the semiconductor substrate 131. Each on-chip lens 132 has a curvature for concentrating incident light on the light-receiving surface of the photodiode PD corresponding thereto.

The glass substrate 134 is, for example, a member that protects the back surface (corresponding to the light-receiving surface) of the semiconductor substrate 131 and keeps the physical strength of the image sensor 100.

The resin layer 133 is an optically transparent epoxy resin, a low melting point glass, a UV curable resin, or the like, and serves to cause a surface from which diffracted light of light reflected from the on-chip lenses 132 and the like is totally reflected to approach the light-receiving surface of the semiconductor substrate 131 by covering at least an effective pixel area 150 on the back surface of the semiconductor substrate 131 with a material having a refractive index higher than that of vacuum, atmospheric air, or the like in addition to attaching the glass substrate 134 to the semiconductor substrate 131. Further, the effective pixel area 150 may be a rectangular area in which the unit pixels 110 used to generate image data are arranged.

Meanwhile, although omitted in FIG. 6, a wiring layer formed from an insulating film which includes wires for connecting the unit pixels 110 and the peripheral circuits may be provided in the surfaces of the semiconductor substrate 131 and the semiconductor substrate 136 which are attached to each other. In this case, for example, a silicon oxide film ($SiO_2$), a silicon nitride film (SiN), or the like can be used for the insulating film of the wiring layer.

The passivation 139 is a film formed using, for example, a photosensitive polyimide, polybenzoxazole (PBO), a silicon resin material, or the like and serves to protect the back surface (the lower surface in the figure) of the semiconductor substrate 136 and the lead electrodes 137.

The lead electrodes 137 are formed using, for example, a conductive material such as a metal and lead electrical connections to the peripheral circuits and the like provided on the semiconductor substrate 136 to the back surface of the semiconductor substrate 136.

The ball bumps 138 are solder balls provided at exposed parts of the lead electrodes 137, for example, and are external terminals for electrically connecting the image sensor 100 and a circuit board and the like. However, the structure of the external terminals is not limited to a structure using the ball bumps 138 and, for example, a structure such as a flat pad may also be employed.

In addition, alignment marks 141 and 142 for alignment during bonding may be provided on the semiconductor substrate 131 and the glass substrate 134.

In the aforementioned configuration, the resin layer 133 is provided, for example, in an area covering at least the effective pixel area 150 on the back surface of the semiconductor substrate 131. Here, when the resin layer 133 is caused to serve to attach the semiconductor substrate 131 to the glass substrate 134, as described above, the resin layer 133 is also formed in an area around the effective pixel area 150 on the back surface of the semiconductor substrate 131. For example, the resin layer 133 is formed on the overall back surface of the semiconductor substrate 131.

In addition, a trench 135 is provided in an area corresponding to at least the effective pixel area 150 on a surface of the glass substrate 134 which faces the semiconductor substrate 131. According to this trench 135, a space (hereinafter referred to as an air gap) 151 is formed in an area corresponding to at least the effective pixel area 150 in the substrate thickness direction of the semiconductor substrate 131 between the resin layer 133 and the glass substrate 134. Further, the substrate thickness direction may be a direction perpendicular to the front surface and the back surface of the semiconductor substrate 131.

The thickness of the air gap 151, that is, the depth of the trench 135, may be 1 μm (micrometers) and may be equal to or less than half a maximum thickness of the glass substrate 134. For example, the depth of the trench 135 can be 1 μm, 5 μm, 10 μm, 100 μm, or the thickness of the glass substrate 134. In addition, the inside of the air gap 151 may be a vacuum or may be filled with a gas such as atmospheric air, nitrogen, or argon (Ar).

In this manner, the cross-sectional structure in the substrate thickness direction in at least the effective pixel area 150 includes the resin layer 133, the air gap 151, and the glass substrate 134 in the present embodiment which are sequentially formed from the side of the semiconductor substrate 131. In other words, the air gap 151 having a refractive index lower than that of the resin layer 133 is interposed between the resin layer 133 and the glass substrate 134.

Since the surface from which diffracted light reflected and diffracted from the periodic structures (on-chip lenses 132, wires, and the like) near the light-receiving surface of the semiconductor substrate 131 is totally reflected can become the interface between the resin layer 133 and the air gap 151 by employing the aforementioned laminated structure, in other words, since the surface from which the diffracted light is totally reflected can be caused to approach the light-receiving surface of the semiconductor substrate 131, a flight distance of the diffracted light in a direction parallel to the light-receiving surface can be reduced. Accordingly, occurrence of the flare phenomenon is reduced, and thus picture quality deterioration can be curbed.

1.8 Manufacturing Method

Next, a method for manufacturing the image sensor 100 according to the first embodiment will be described in detail with reference to the drawings. FIG. 7 to FIG. 13 are process cross-sectional views showing an example of a method for manufacturing the image sensor according to the first embodiment.

Figure 7:
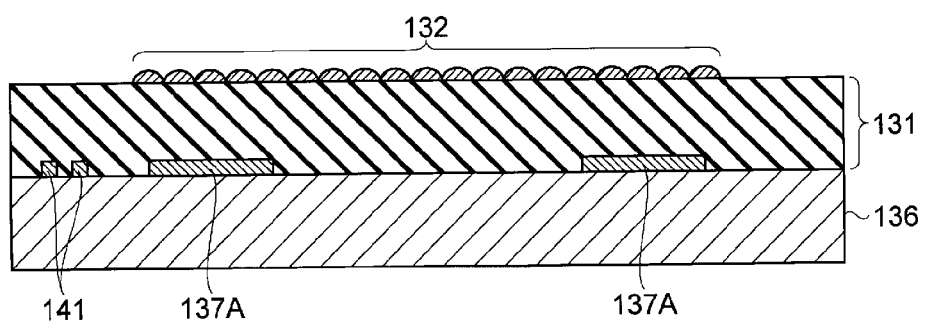
FIG. 7 is a process cross-sectional view showing an example of a method for manufacturing the image sensor according to the first embodiment (1).

In the present manufacturing method, as shown in FIG. 7, a semiconductor chip including the semiconductor substrate 131 including a plurality of photodiodes PD and transfer transistors 111 arranged in a matrix form, the semiconductor substrate 136 including other circuit elements in the unit pixels 110 and the peripheral circuits, and the on-chip lenses 132 for the respective unit pixels 110 is manufactured. Further, electrode pads 137A that are parts of the lead electrodes 137 may be formed on the front surface side of the semiconductor substrate 136.

Figure 8:
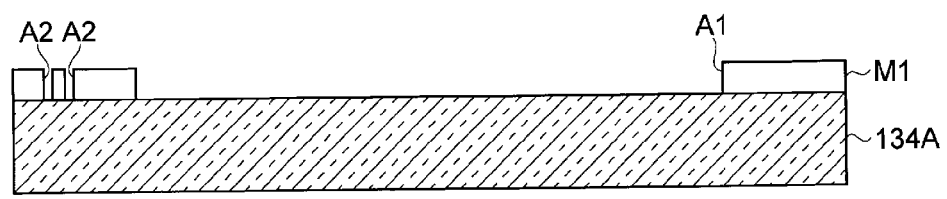
FIG. 8 is a process cross-sectional view showing an example of the method for manufacturing the image sensor according to the first embodiment (2).

On the other hand, in a process of manufacturing the glass substrate 134, first, a mask M1 having an opening A1 in the same shape as the opening shape of the trench 135 is formed on a main surface (which is assumed to be a back surface) of a glass substrate 134A that is a base of the glass substrate 134, as shown in FIG. 8.

The mask M1 may be, for example, a photosensitive resist film or the like formed through photolithography. In addition, an opening A2 for forming the alignment marks 142 may be provided in the mask M1.

Figure 9:
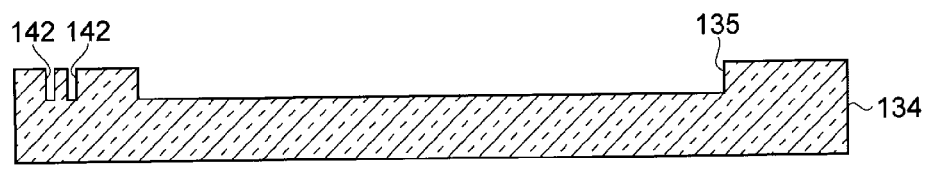
FIG. 9 is a process cross-sectional view showing an example of the method for manufacturing the image sensor according to the first embodiment (3).

Next, the back surface of the glass substrate 134A on which the mask M1 is formed is etched to manufacture the glass substrate 134 in which the trench 135 and the alignment marks 142 are formed, as shown in FIG. 9. To etch the glass substrate 134A, either of dry etching or wet etching may be used. In addition, after formation of the trench 135 and the alignment marks 142, the mask M1 is removed using a predetermined removal solution or the like.

Figure 10:
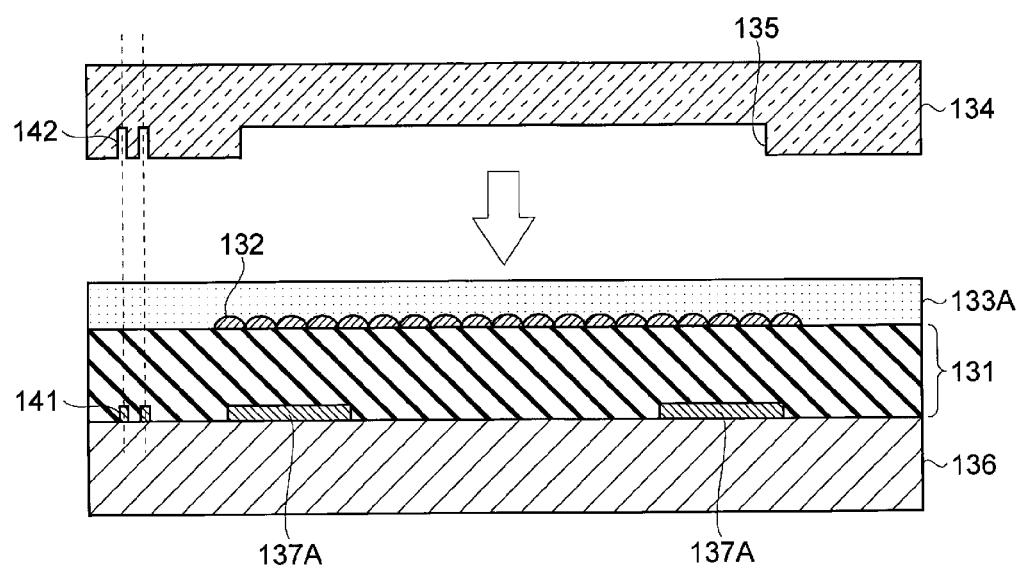
FIG. 10 is a process cross-sectional view showing an example of the method for manufacturing the image sensor according to the first embodiment (4).

Next, as shown in FIG. 10, a resin layer 133A that has not solidified is formed on the back surface of the semiconductor substrate 131, and the resin layer 133A is solidified in a state in which the glass substrate 134 is disposed on the resin layer 133A to attach the semiconductor substrate 131 and the glass substrate 134 to each other. In this attachment, both substrates are aligned using the alignment marks 141 provided in the semiconductor substrate 131 and the alignment marks 142 provided in the glass substrate 134.

Further, the resin layer 133A that has not solidified may be in a gel state or a sheet state. Here, a high viscosity material may be used for the resin layer 133A in order to curb sinking of the glass substrate 134 to improve dimensional accuracy of the air gap 151. However, when the resin layer 133A in a low viscosity gel state is used, excessive sinking of the glass substrate 134 may be prevented by inserting spacers around the effective pixel area 150.

In addition, heating, ultraviolet radiation, and the like may be used to solidify the resin layer 133A. Here, a solidification process may be divided into two or more steps and executed in order to curb sinking of the glass substrate 134 to improve the dimensional accuracy of the air gap 151. For example, the viscosity of the resin layer 133A may be increased in the first solidification process and the resin layer 133A may be sufficiently solidified in the second and following processes.

Further, although it is desirable not to apply a weight to the glass substrate 134 when the resin layer 133A is solidified, the glass substrate 134 may be pressed or receive a force against the resin layer 133A as necessary.

Figure 11:
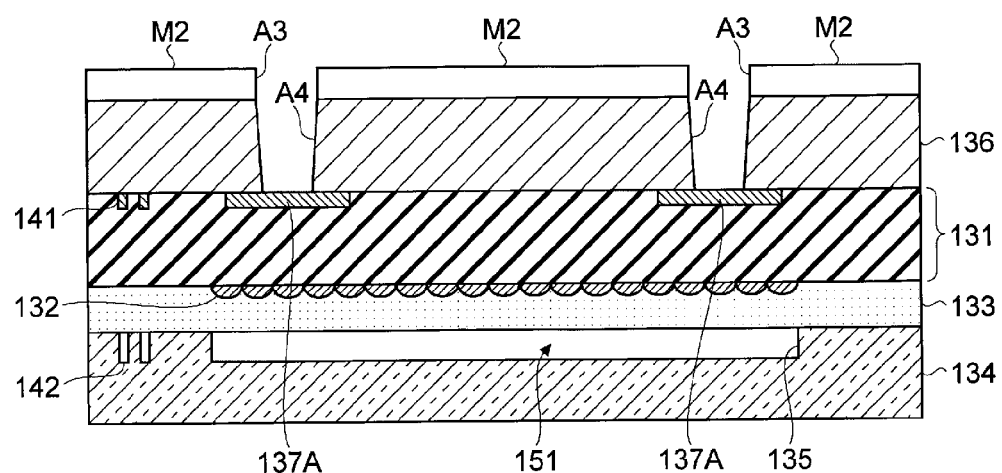
FIG. 11 is a process cross-sectional view showing an example of the method for manufacturing the image sensor according to the first embodiment (5).

Next, as shown in FIG. 11, a mask M2 having an opening A3 is formed in areas corresponding to the electrode pads 137A in the substrate thickness direction of the semiconductor substrate 136 on the back surface of the semiconductor substrate 136 attached to the front surface side of the semiconductor substrate 131, and the semiconductor substrate 136 is etched through this mask M2 to form openings A4 that penetrate the semiconductor substrate 136 to expose the electrode pads 137A. Further, the mask M2 may be, for example, a photosensitive resist film or the like formed through photolithography. In addition, to etch a wiring layer 1036, either of dry etching or wet etching may be used.

Figure 12:
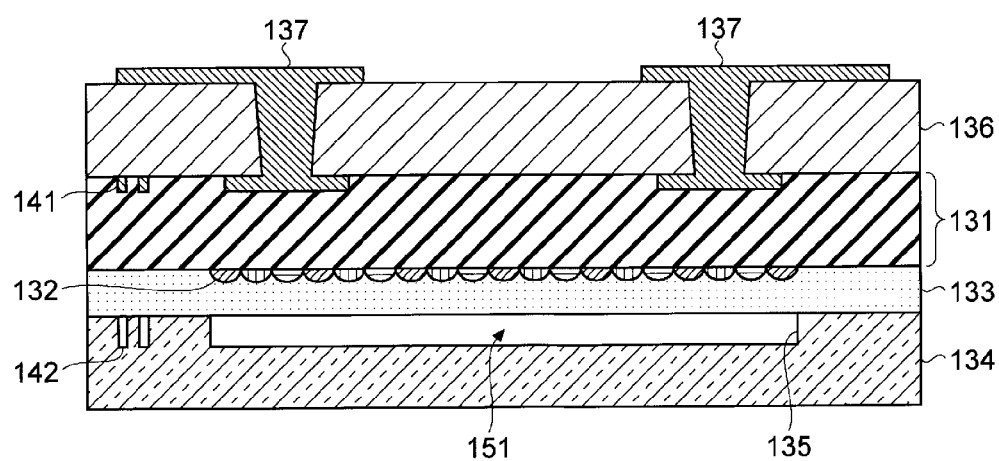
FIG. 12 is a process cross-sectional view showing an example of the method for manufacturing the image sensor according to the first embodiment (6).

Next, as shown in FIG. 12, a conductive layer in contact with the electrode pads 137A is formed over the inside of the openings A4 to a part of the back surface of the semiconductor substrate 136 using, for example, a method such as lift-off, to form the lead electrodes 137.

Figure 13:
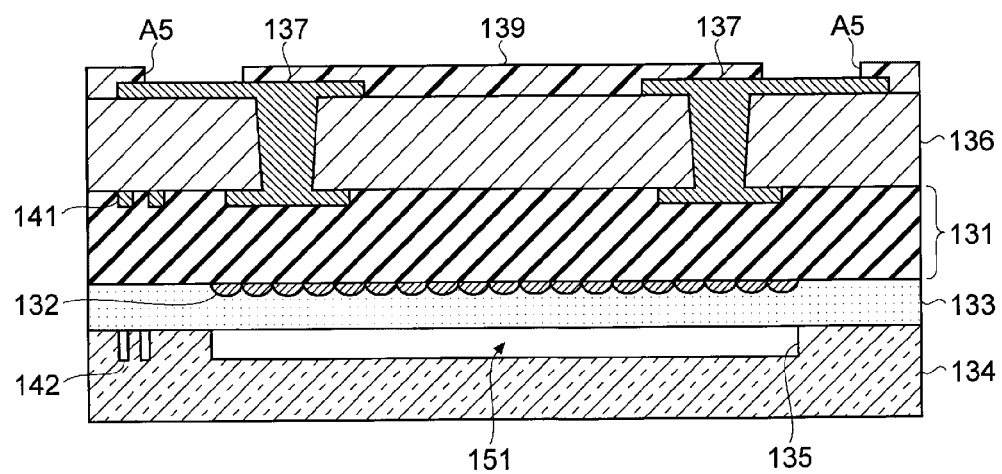
FIG. 13 is a process cross-sectional view showing an example of the method for manufacturing the image sensor according to the first embodiment (7).

Next, as shown in FIG. 13, the passivation 139 having openings A5 exposing parts of the lead electrodes 137 formed on the back surface of the semiconductor substrate 136 is formed, and then the ball bumps 138 such as solder balls are formed on the lead electrodes 137 exposed through the openings A5. Accordingly, the image sensor 100 having the cross-sectional structure as illustrated in FIG. 6 is manufactured.

1.9 Operation and Effects

As described above, in the present embodiment, the air gap 151 that is a vacuum or is filled with a gas is provided between the resin layer 133 and the glass substrate 134 above at least the effective pixel area 150. Accordingly, the surface from which diffracted light reflected and diffracted from the periodic structures (on-chip lenses 132, wires, and the like) near the light-receiving surface of the semiconductor substrate 131 is totally reflected can become the interface between the resin layer 133 and the air gap 151, in other words, the surface from which the diffracted light is totally reflected can be caused to approach the light-receiving surface of the semiconductor substrate 131, and thus a flight distance of the diffracted light in a direction parallel to the light-receiving surface can be reduced. Consequently, it is possible to reduce occurrence of the flare phenomenon and curb picture quality deterioration.

1.10 Modified Example

Figure 14:
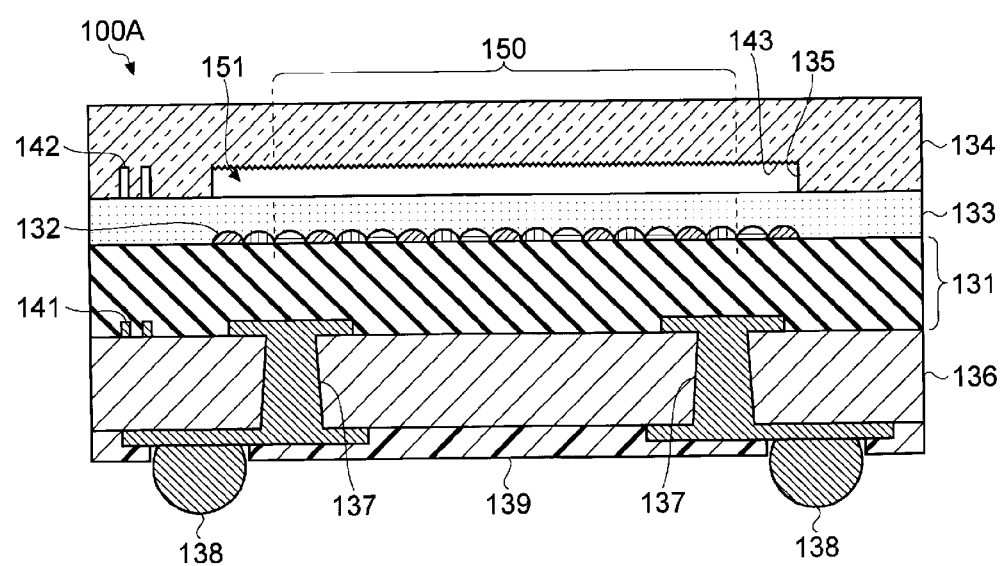
FIG. 14 is a cross-sectional view showing an example of a cross-sectional structure of an image sensor according to a modified example of the first embodiment.

FIG. 14 is a cross-sectional view showing an example of a cross-sectional structure of an image sensor according to a modified example of the first embodiment. In the image sensor 100A illustrated in FIG. 14, the roughness of the bottom surface 143 of the trench 135 formed in the glass substrate 134 may be higher than the roughness of another surface of the glass substrate 134 (e.g., the surface of the glass substrate 134 opposite the semiconductor substrate 131). For example, since reflection occurring at the boundary between the glass substrate 134 and the air gap 151 can be reduced by forming prominences and depressions such as a moth-eye structure on the bottom surface 143, the flare phenomenon can be further reduced and picture quality deterioration can be curbed.

Meanwhile, a configuration in which the roughness of the bottom surface of the trench formed on the glass substrate is increased is not limited to the first embodiment and can be equally applied to other embodiments which will be described later.

2. Second Embodiment

Next, a solid-state imaging device and an electronic apparatus according to the second embodiment will be described in detail with reference to the drawings. Further, in the following description, the same components as those in the above-described embodiment are denoted by the same signs and redundant description is omitted.

In the second embodiment, the image sensor 100 is substituted with an image sensor 200 which will be described later in the electronic apparatus 1000 according to the first embodiment. The image sensor 200 has the same functional configuration as the image sensor 100 described using FIG. 2 and the like. However, the image sensor 200 has a cross-sectional structure as exemplified in the following description in the present embodiment.

2.1 Example of Cross-Sectional Structure

Figure 15:
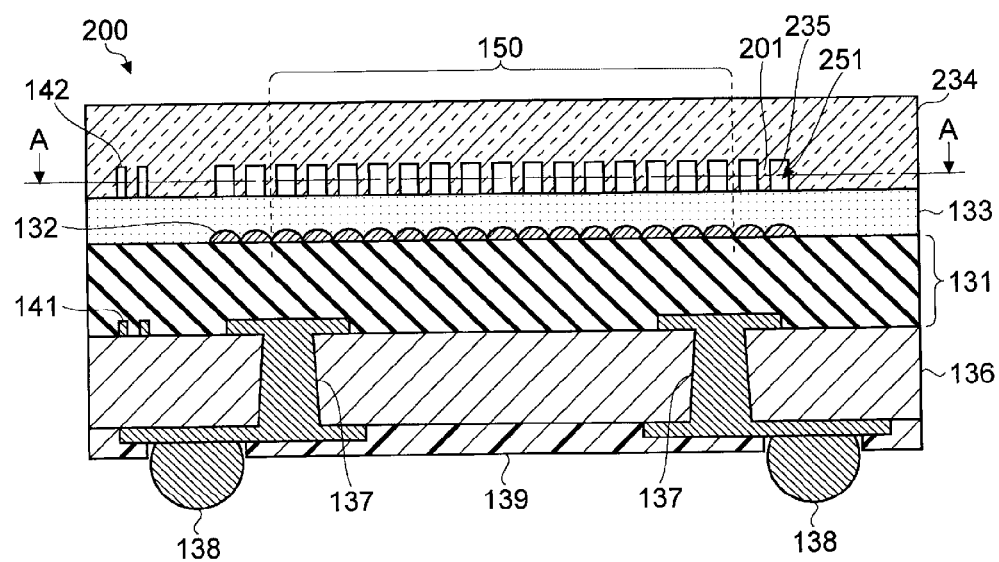
FIG. 15 is a cross-sectional view showing an example of a cross-sectional structure of an image sensor according to a second embodiment.
Figure 16:
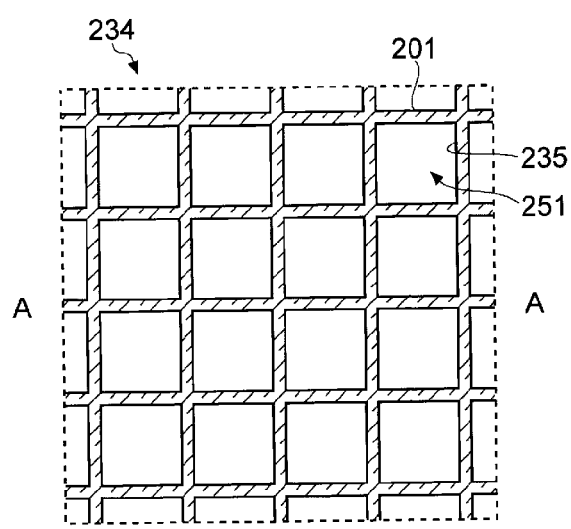
FIG. 16 is a cross-sectional view showing an example of a partial cross-sectional structure of plane A-A in FIG. 15.
Figure 17:
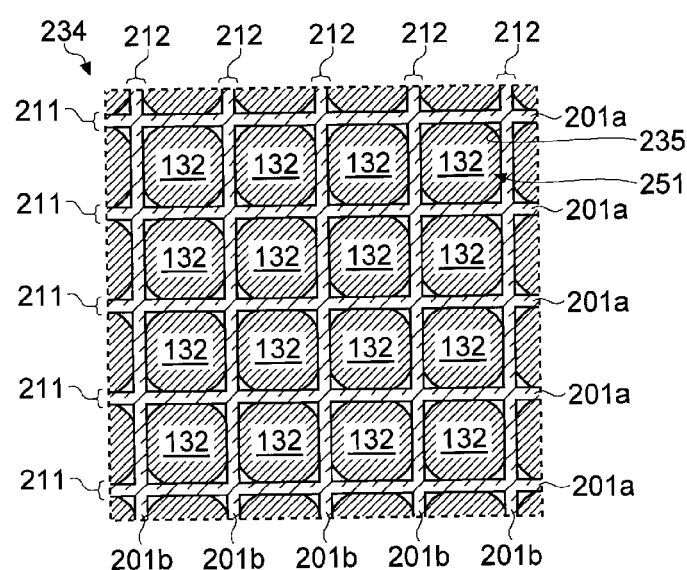
FIG. 17 is a transmissive diagram showing an example of a positional relationship between air gaps and on-chip lenses according to the second embodiment.

FIG. 15 is a cross-sectional view showing an example of a cross-sectional structure of the image sensor according to the second embodiment. FIG. 16 is a cross-sectional view showing an example of a partial cross-sectional structure of plane A-A in FIG. 15. FIG. 17 is a transmissive diagram showing an example of a positional relationship between air gaps and on-chip lenses according to the second embodiment. Meanwhile, although a case in which the image sensor 200 is of the back surface radiation type is exemplified in the present disclosure, it may be of the back surface radiation type or the front surface radiation type as in the first embodiment.

As shown in FIG. 15, in the image sensor 200, the glass substrate 134 is substituted with a glass substrate 234 in the same configuration as that of the image sensor 100 described using FIG. 6 and the like.

As shown in FIG. 15 and FIG. 16, the glass substrate 234 has a structure in which the trench 135 described in the first embodiment using FIG. 6 and the like is divided into a plurality of trenches 235 by partition walls 201 extending in a lattice form. That is, in the present embodiment, the air gap 151 according to the first embodiment is partitioned into a plurality of air gaps 251 arranged in a matrix form by the partition walls 201 in a lattice form. Further, the partition walls 201 may be structures in a pillar shape or a wall shape which support the glass substrate 234 against the semiconductor substrate 131.

In addition, as shown in FIG. 17, the plurality of trenches 235 (i.e., the plurality of air gaps 251) are, for example, arranged in a matrix form such that the optical centers of the on-chip lenses 132 correspond one-to-one to the centers of the air gaps 251 when the semiconductor substrate 131 is viewed in the substrate thickness direction.

Here, row partition walls 201a extending in the row direction among the partition walls 201 in a lattice form are provided along boundary parts 211 of on-chip lenses 132 arranged in the column direction, and column partition walls 201b extending in the column direction are provided along boundary parts 212 of on-chip lenses 132 arranged in the row direction.

The boundary parts 211 and 212 of the on-chip lenses 132 arranged in a matrix form correspond to the boundary parts of the photodiodes PD. Accordingly, shielding of light incident on the photodiodes PD through the on-chip lenses 132 by the partition walls 201 can be reduced by providing the partition walls 201 along the boundary parts 211 and 212, and thus deterioration of quantum efficiency due to provision of the partition walls 201 can be curbed.

Further, it is desirable that the width of the partition walls 201 be as narrow as possible within a range in which sufficient physical strength for the glass substrate 234 and the image sensor 200 is obtained. Here, when neighboring photodiodes PD are optically isolated by a pixel isolation part such as a deep trench isolation (DTI) or a front full trench isolation (FFTI), for example, the width of the partition walls 201 may be greater than or less than the width of the pixel isolation part.

2.2 Manufacturing Method

Figure 18:
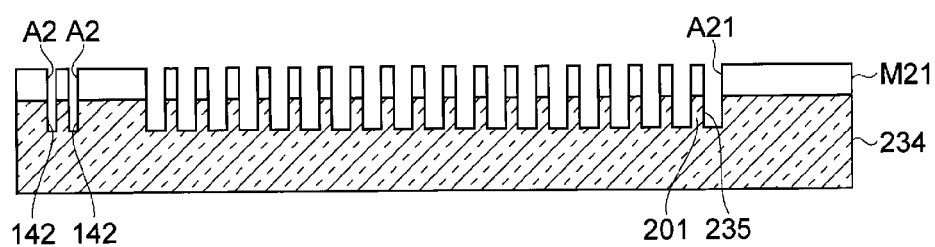
FIG. 18 is a process cross-sectional view showing an example of a method for manufacturing the image sensor according to the second embodiment.

Next, a method for manufacturing the image sensor 200 according to the second embodiment will be described in detail with reference to the drawings. Further, in the following description, redundant description with respect to the same processes as those in the method for manufacturing the image sensor 100 according to the first embodiment is omitted by referring to the same. FIG. 18 is a process cross-sectional view showing an example of a method for manufacturing the image sensor according to the second embodiment.

In the present manufacturing method, first, the semiconductor chip including the semiconductor substrate 131 including the plurality of photodiodes PD and the transfer transistors 111 arranged in a matrix form, the semiconductor substrate 136 including other circuit elements in the unit pixels 110 and the peripheral circuits, and the on-chip lenses 132 for the respective unit pixels 110 is manufactured through the same process as described in the first embodiment using FIG. 7.

On the other hand, in the present embodiment, first, a mask M21 having openings A21 in the same shape as the opening shape of the trenches 235 is formed on a main surface (which is assumed to be the back surface) of a glass substrate 234A that is a base of the glass substrate 234 in a process of manufacturing the glass substrate 234. The mask M21 may be, for example, a photosensitive resist film or the like formed through photolithography. In addition, the openings A2 for forming the alignment marks 142 may be formed in the mask M21.

Next, the back surface of the glass substrate 234A on which the mask M1 is formed is etched to manufacture the glass substrate 234 in which the trenches 235 and the alignment marks 142 are formed, as shown in FIG. 18. To etch the glass substrate 234A, either of dry etching or wet etching may be used. In addition, after the trenches 235 and the alignment marks 142 are formed, the mask M21 is removed using a predetermined removal solution or the like.

Thereafter, the glass substrate 234 is bonded to the semiconductor substrate 131 using the resin layer 133 and then the lead electrodes 137 and the ball bumps 138 are formed according to the same configurations described in the first embodiment using FIG. 10 to FIG. 13 to manufacture the image sensor 200 having the cross-sectional structure as shown in FIG. 15.

2.2.1 Modified Example of Manufacturing Method

Figure 19:
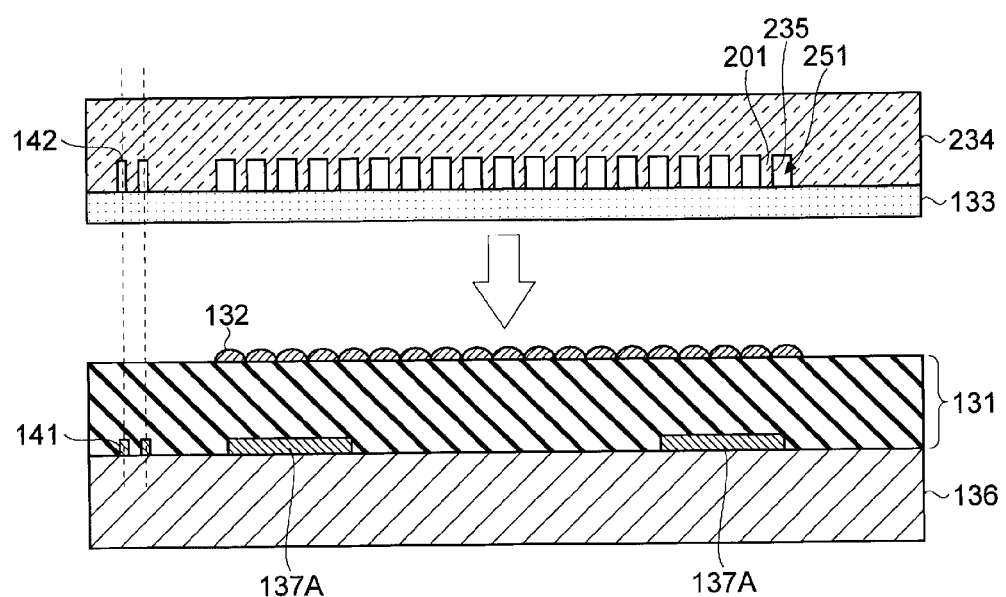
FIG. 19 is a process cross-sectional view showing an example of a method for manufacturing the image sensor according to a modified example of the second embodiment.

Meanwhile, although a case in which the resin layer 133A is formed on the back surface of the semiconductor substrate 131 on which the on-chip lenses 132 are formed and the glass substrate 234 is bonded to this resin layer 133A (refer to FIG. 10) is exemplified in the present embodiment as in the first embodiment, the surface on which the resin layer 133A is formed is not limited to the surface on the side of the semiconductor substrate 131 and may be the surface of the glass substrate 235 in which the trenches 234 are formed, for example, as illustrated in FIG. 19. However, when the resin layer 133A is formed on the surface of the glass substrate 234 in which the trenches 235 are formed, an adhesive material in a sheet form may be used as a material of the resin layer 133A.

2.3 Lens Function of Resin Layer

Figure 20:
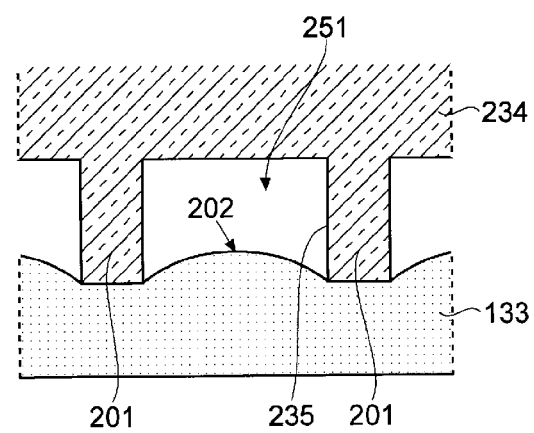
FIG. 20 is a cross-sectional view showing an example of a cross-sectional structure of a resin layer according to the second embodiment.

FIG. 20 is a cross-sectional view showing an example of a cross-sectional structure of the resin layer according to the second embodiment. As in the present embodiment, when the trenches 235 are formed in one-to-one correspondence with the on-chip lenses 132, there are cases in which the resin layer 133 solidified in a state in which it is pressed by the partition walls 201 in a lattice form has a shape with a raised center part like a lens in a range partitioned by the trenches 235, as shown in FIG. 20. In such a case, light incident on the resin layer 133 in each trench 235 through the glass substrate 234 is concentrated on the basis of curvature of the upper surface 202 of the resin layer 133.

For example, when an adhesive material in a gel state or a sufficiently soft adhesive material in a sheet form is used as the resin layer 133, the resin layer 133 that has not solidified is pressed by the weight of the glass substrate 234 or an added force, and thus the center part of each trench 235 is raised like a lens.

In such a case, the curvature of each on-chip lens 132 may be set such that concentrated light transmitted by the on-chip lenses 132 is concentrated in the photodiodes PD in consideration of the curvature of the front surface of the resin layer 133.

Further, the curvature of the surface of the resin layer 133 can be obtained in advance in consideration of the weight of the glass substrate 234, the viscosity of the resin layer 133 that has not solidified, a time and a process required for solidification, and the like.

2.4 Pupil Correction

In addition, although a case in which the air gaps 251 corresponding one-to-one to the respective on-chip lenses 132 are provided above the on-chip lenses 132 is exemplified in the above description, a positional relationship between each on-chip lens 132 and each air gap 251 may be pupil-corrected in response to an image height. In this case, the positions of the air gaps 251 with respect to the on-chip lenses 132 are shifted to the center of the effective pixel area 150 as they become closer to the outer circumference of the effective pixel area 150.

2.5 Operation and Effects

As described above, according to the present embodiment, it is possible to improve the strength of the image sensor 200 and curb occurrence of warping and the like because the partition walls 201 serving as pillars supporting the glass substrate 234 with respect to the semiconductor substrate 131 are provided between the glass substrate 234 and the semiconductor substrate 131.

In addition, it is also possible to curb deterioration of quantum efficiency due to provision of the partition walls 201 because it is possible to reduce shielding of light incident on the on-chip lenses 132 by the partition walls 201 by positioning the partition walls 201 at the boundary parts 211 and/or 212 of the on-chip lenses 132 adjacent thereto.

Other configurations, operations, and effects may be the same as those in the above-described embodiment, and thus detailed description is omitted here.

2.6 Modified Examples of Glass Substrate

Next, several modified examples of the glass substrate 234 will be described.

2.6.1 First Modified Example

Figure 21:
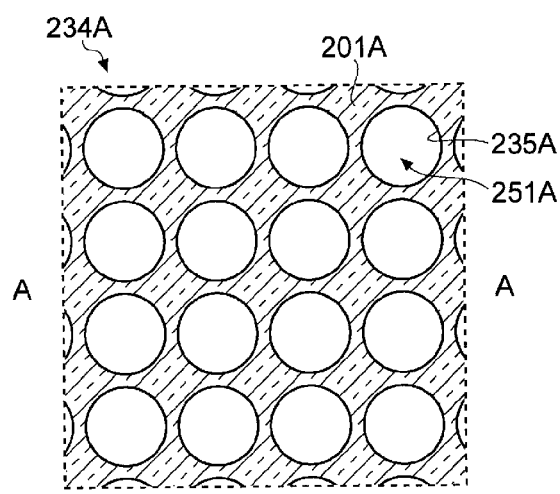
FIG. 21 is a cross-sectional view showing a schematic configuration example of a glass substrate according to a first modified example of the second embodiment.

FIG. 21 is a cross-sectional view showing a schematic configuration example of a glass substrate according to the first modified example. Further, FIG. 21 illustrates an example of a partial cross-sectional structure of plane A-A in FIG. 15 like FIG. 16.

As shown in FIG. 21, in a glass substrate 234A, the rectangular trenches 235 (i.e., air gaps 251) in the glass substrate 234 are substituted with circular trenches 235A (i.e., air gaps 251A in which a surface parallel to an element formation surface has a circular shape).

Using these circular air gaps 251A, it is also possible to curb picture quality deterioration due to the flare phenomenon while improving the strength of the glass substrate 234A and the image sensor 200 as in the second embodiment.

In addition, since it is possible to reduce shielding of light incident on the on-chip lenses 132 by partition walls 201A by aligning the centers of the air gaps 251A with the centers of the on-chip lenses 132 in the substrate thickness direction of the semiconductor substrate 131, deterioration of quantum efficiency due to provision of the partition walls 201 can also be curbed.

Meanwhile, the shape of the surface parallel to the element formation surface is not limited to the circle and may be modified in various manners such as an oval and a polygon with three or more sides.

2.6.2. Second Modified Example

Figure 22:
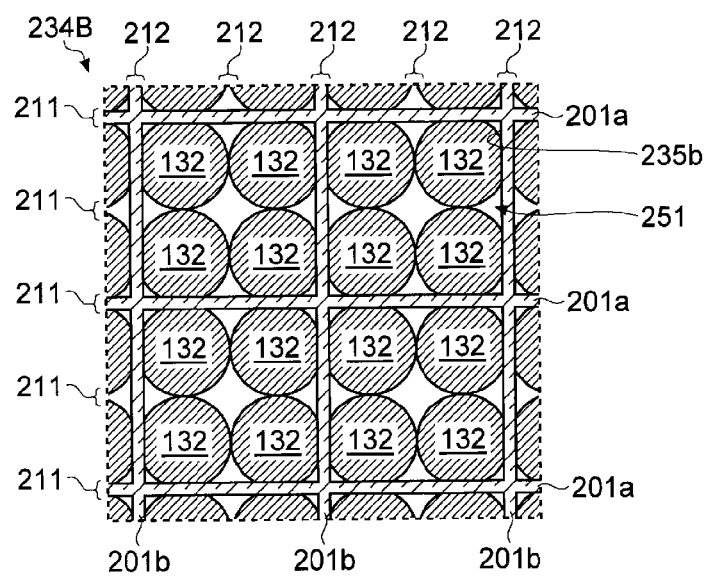
FIG. 22 is a transmissive diagram showing an example of a corresponding relationship between air gaps and on-chip lenses according to a second modified example of the second embodiment.

FIG. 22 is a transmissive diagram showing an example of a corresponding relationship between air gaps and on-chip lenses according to the second modified example.

Although a case in which the row partition walls 201a and the column partition walls 201b are provided such that one trench 235 (i.e., air gap 251) corresponds to one on-chip lens 132 is exemplified in the above-described second embodiment, the present embodiment is not limited to such a configuration. For example, as in a glass substrate 235B illustrated in FIG. 22, the row partition walls 201a and the column partition walls 201b may be provided such that one trench 235b corresponds to a plurality of (a total of 4 of 2×2 in FIG. 22) on-chip lenses 132, in other words, such that a plurality of on-chip lenses arranged in a matrix form are partitioned into sets of a plurality of (a total of 4 of 2×2 in FIG. 22) on-chip lenses 132.

By employing this configuration, it is also possible to curb picture quality deterioration due to the flare phenomenon while improving the strength of the glass substrate 234B and the image sensor 200 as in the second embodiment.

Meanwhile, the number of photodiodes PD divided by the row partition walls 201a and the column partition walls 201b is not limited to a total of 4 of 2×2 and may be m (m is an integer equal to or greater than 1)×n (n is an integer equal to or greater than 1).

2.6.3 Third Modified Example

Figure 23:
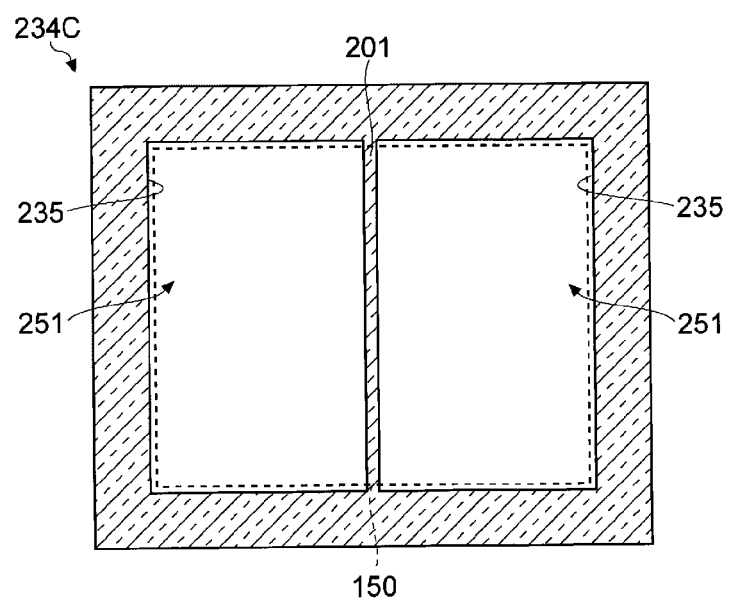
FIG. 23 is a cross-sectional view showing a schematic configuration example of a glass substrate according to a third modified example of the second embodiment.

FIG. 23 is a cross-sectional view showing a schematic configuration example of a glass substrate according to the third modified example. Further, FIG. 23 illustrates an example of a partial cross-sectional structure of plane A-A in FIG. 15.

As illustrated in FIG. 23, at least one partition wall 201 may be provided on the glass substrate 234C in order to maintain the strength of the image sensor 200.

For example, by providing at least one partition wall 201 such that the air gap 151 according to the first embodiment is divided, it is possible to curb picture quality deterioration due to the flare phenomenon while improving the strength of the glass substrate 234C and the image sensor 200 as in the second embodiment.

2.6.4 Fourth Modified Example

Figure 24:
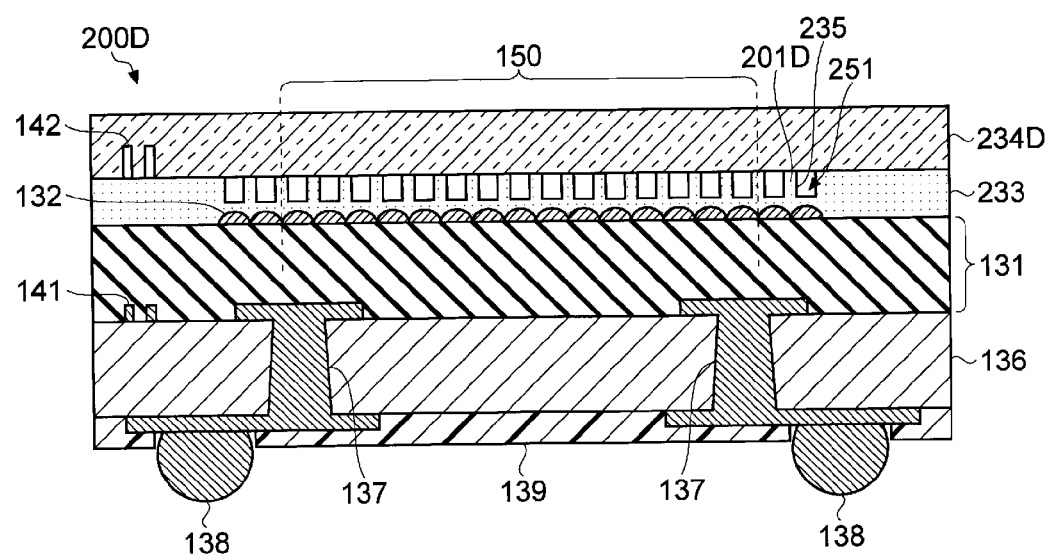
FIG. 24 is a cross-sectional view showing an example of a cross-sectional structure of an image sensor according to a fourth modified example of the second embodiment.

FIG. 24 is a cross-sectional view showing an example of a cross-sectional structure of an image sensor according to the fourth modified example. Further, FIG. 24 illustrates a cross section corresponding to the cross section illustrated in FIG. 15.

As in the image sensor 200D illustrated in FIG. 24, partition walls 201D supporting a glass substrate 234D with respect to the semiconductor substrate 131 may be formed using a resin layer 233.

By employing this configuration, it is also possible to curb picture quality deterioration due to the flare phenomenon while improving the strength of the glass substrate 234D and the image sensor 200 as in the second embodiment.

Further, the partition walls 201D using the resin layer 233 may be formed, for example, by exposing the upper layer of the resin layer into a pattern in the same shape as the opening pattern of the trenches 235 and solidifying the exposed upper layer using different resin layers for the upper layer (side of the glass substrate 234D) and the lower layer (side of the semiconductor substrate 131) of the resin layer 233.

3. Third Embodiment

Next, a solid-state imaging device and an electronic apparatus according to the third embodiment will be described in detail with reference to the drawings.

Further, in the following description, the same components as those in the above-described are denoted by the same signs and redundant description is omitted.

In the third embodiment, the image sensor 100 is substituted with an image sensor 300 which will be described later in the electronic apparatus 1000 according to the first embodiment. The image sensor 300 has, for example, the same functional configuration as the image sensor 100 described in the first embodiment using FIG. 2 and the like. However, in the present embodiment, the image sensor 300 has a cross-sectional structure as exemplified in the following description.

3.1 Example of Cross-Sectional Structure

Figure 25:
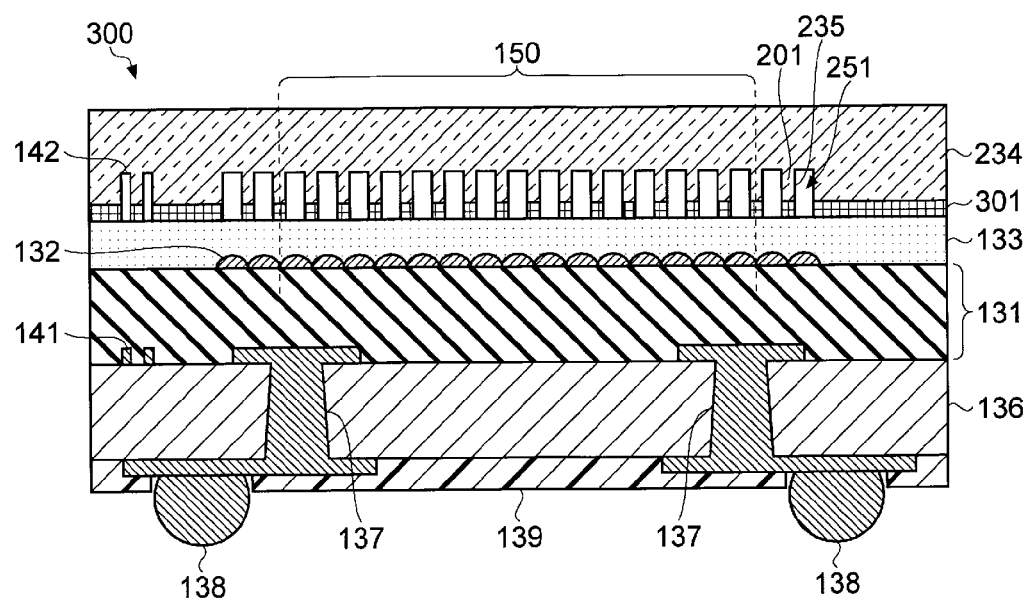
FIG. 25 is a cross-sectional view showing an example of a cross-sectional structure of an image sensor according to a third embodiment.

FIG. 25 is a cross-sectional view showing an example of a cross-sectional structure of the image sensor according to the third embodiment. Further, although a case in which the image sensor 300 is of the back surface radiation type is exemplified in the present description, it may be of the back surface radiation type or the front surface radiation type as in the first embodiment.

As shown in FIG. 25, the image sensor 300 includes a light-shielding film 301 provided on a surface in contact with the resin layer 133 in the glass substrate 234 in the same configuration as the image sensor 200 describing in the second embodiment using FIG. 15 and the like.

As a material of the light-shielding film 301, for example, a material having a visible light shielding characteristic, such as tungsten (W), titanium (Ti), or carbon resist, can be used.

In addition, the partition walls 201 in the present embodiment are disposed at the boundary parts 211 and 212 of neighboring on-chip lenses 132 as described in the second embodiment.

By employing this configuration, it is possible to reduce leak of light incident on an air gap 251 corresponding to a certain unit pixel 110 into an on-chip lens 132 corresponding to a neighboring unit pixel 110, so-called leak of light into a neighboring pixel. Accordingly, a pixel isolation characteristic of the image sensor 300 can be improved to reduce color mixing, and thus it is possible to curb picture quality deterioration.

3.2 Manufacturing Method

Figure 26:
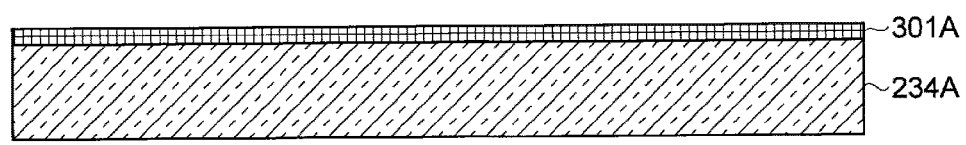
FIG. 26 is a process cross-sectional view showing an example of a method for manufacturing the image sensor according to the third embodiment (1).
Figure 27:
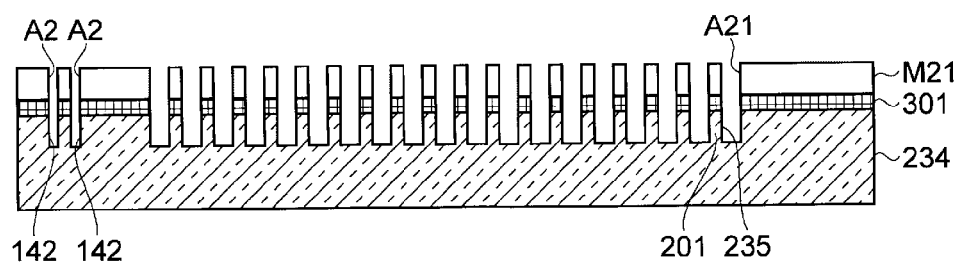
FIG. 27 is a process cross-sectional view showing an example of the method for manufacturing the image sensor according to the third embodiment (2).

Next, a method for manufacturing the image sensor 300 according to the third embodiment will be described in detail with reference to the drawings. Further, in the following description, redundant description with respect to the same processes as those in the method for manufacturing the image sensor 100 or 200 according to the first or second embodiment is omitted by referring to the same. FIG. 26 and FIG. 27 are process cross-sectional views showing an example of a method for manufacturing the image sensor according to the third embodiment.

In the present manufacturing method, first, the semiconductor chip including the semiconductor substrate 131 including the plurality of photodiodes PD and the transfer transistors 111 arranged in a matrix form, the semiconductor substrate 136 including other circuit elements in the unit pixels 110 and the peripheral circuits, and the on-chip lenses 132 for the respective unit pixels 110 is manufactured through the same process as described in the first embodiment using FIG. 7.

On the other hand, in the present embodiment, first, a light-shielding film 301A is formed on a main surface (which is assumed to be the back surface) of a glass substrate 234A that is a base of the glass substrate 234, as shown in FIG. 26, in a process of manufacturing the glass substrate 234.

Next, the mask M21 having openings A21 in the same shape as the opening shape of the trenches 235 is formed on the light-shielding film 301A. The mask M21 may be formed through the same process as described in the second embodiment using FIG. 18.

Next, the back surface of the glass substrate 234A on which the mask M1 is formed is etched to manufacture the glass substrate 234 including the trenches 235 and the alignment marks 142 and having the light-shielding film 301 formed at least on the bottom surfaces of the partition walls 201, as shown in FIG. 27. The glass substrate 234A may be etched through the same process as described in the second embodiment using FIG. 18. In addition, after the trenches 235, the alignment marks 142, and the light-shielding film 301 are formed, the mask M21 is removed using a predetermined removal solution or the like.

Thereafter, the glass substrate 234 is bonded to the semiconductor substrate 131 using the resin layer 133 and then the lead electrodes 137 and the ball bumps 138 are formed according to the same configurations described in the first embodiment using FIG. 10 to FIG. 13 to manufacture the image sensor 300 having the cross-sectional structure as illustrated in FIG. 25.

3.3 Operation and Effects

As described above, according to the third embodiment, the light-shielding film 301 is provided on the bottom surfaces of the partition walls 201 in at least the effective pixel area 150. Accordingly, it is possible to reduce leak of light incident on an air gap 251 corresponding to a certain unit pixel 110 into an on-chip lens 132 corresponding to a neighboring unit pixel 110, so-called leak of light into a neighboring pixel, and thus it is possible to improve the pixel isolation characteristic of the image sensor 300 to reduce color mixing, thereby curbing picture quality deterioration.

Further, although a case based on the image sensor 200 according to the second embodiment is exemplified in the present embodiment, the embodiment that is a base is not limited to the second embodiment and the base may be other embodiments or modified examples thereof, such as modified examples of the second embodiment and the first embodiment.

In addition, other configurations, operations, and effects may be the same as those in the above-described embodiments, and thus detailed description is omitted here.

4. Fourth Embodiment

Next, a solid-state imaging device and an electronic apparatus according to the fourth embodiment will be described in detail with reference to the drawings.

Further, in the following description, the same components as those in the above-described embodiment are denoted by the same signs and redundant description is omitted.

In the fourth embodiment, the image sensor 100 is substituted with an image sensor 400 which will be described later in the electronic apparatus 1000 according to the first embodiment. The image sensor 400 has, for example, the same functional configuration as the image sensor 100 described in the first embodiment using FIG. 2 and the like. However, the image sensor 400 has a cross-sectional structure as exemplified in the following description in the present embodiment.

4.1 Example of Cross-Sectional Structure

Figure 28:
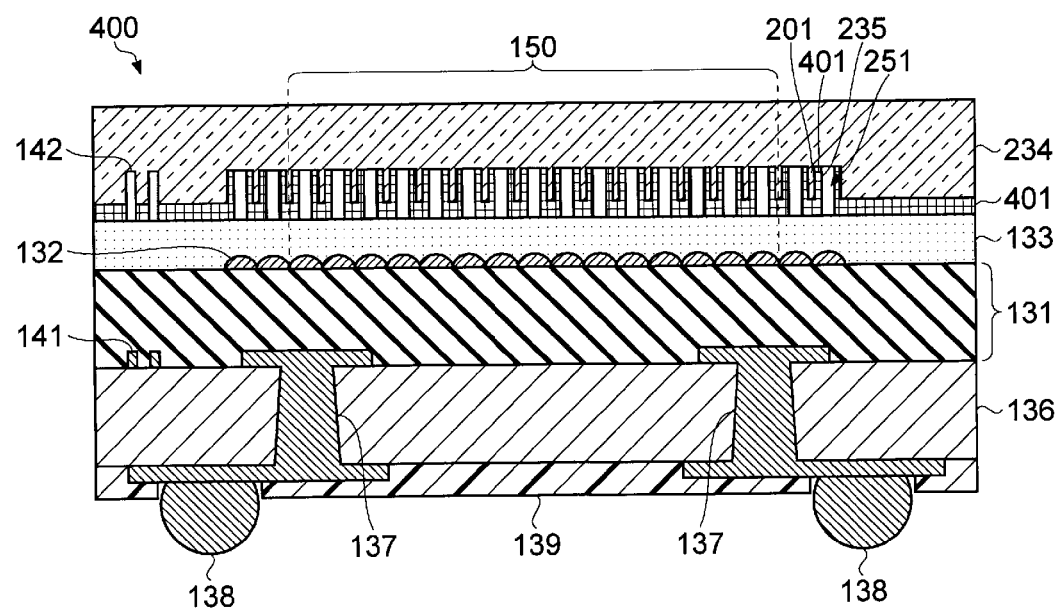
FIG. 28 is a cross-sectional view showing an example of a cross-sectional structure of an image sensor according to a fourth embodiment.

FIG. 28 is a cross-sectional view showing an example of a cross-sectional structure of the image sensor according to the fourth embodiment. Further, although a case in which the image sensor 400 is of the back surface radiation type is exemplified in the present description, it may be of the back surface radiation type or the front surface radiation type as in the first embodiment.

As shown in FIG. 28, the image sensor 400 includes a light-shielding film 401 provided on sides of the partition walls 201 in addition to the bottom surfaces of the partition walls 201 in the glass substrate 234 in the same configuration as the image sensor 300 described in the third embodiment using FIG. 25 and the like.

As a material of the light-shielding film 401, for example, a material having the visible light shielding characteristic, such as tungsten (W), titanium (Ti), or carbon resist, can be used, like the light-shielding film 301 according to the third embodiment.

In addition, the partition walls 201 in the present embodiment are disposed at the boundary parts 211 and 212 of neighboring on-chip lenses 132 as described in the second embodiment.

By employing this configuration, it is possible to further reduce leak of light into neighboring pixels. Accordingly, since the pixel isolation characteristic of the image sensor 400 can be further improved to further reduce color mixing, it is possible to further curb picture quality deterioration.

4.2 Manufacturing Method

Figure 29:
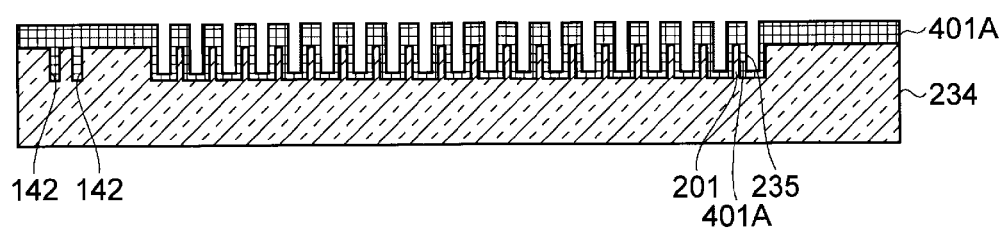
FIG. 29 is a process cross-sectional view showing an example of a method for manufacturing the image sensor according to the fourth embodiment (1).
Figure 30:
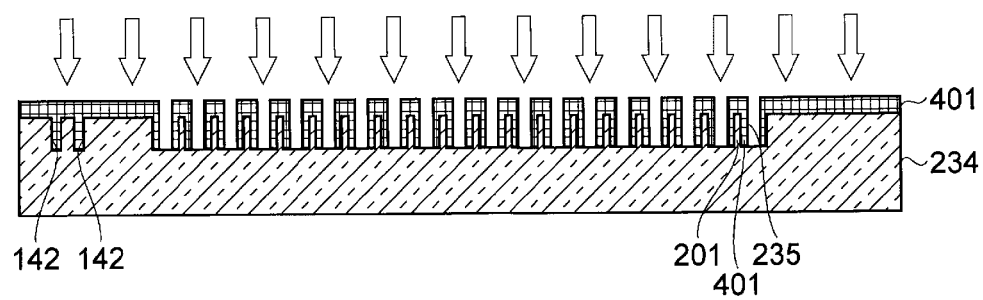
FIG. 30 is a process cross-sectional view showing an example of the method for manufacturing the image sensor according to the fourth embodiment (2).

Next, a method for manufacturing the image sensor 400 according to the fourth embodiment will be described in detail with reference to the drawings. Further, in the following description, redundant description with respect to the same processes as those in the methods for manufacturing the image sensor 100, 100A, 200, 200D, or 300 according to the above-described embodiments is omitted by referring to the same. FIG. 29 and FIG. 30 are process cross-sectional views showing an example of a method for manufacturing the image sensor according to the fourth embodiment.

In the present manufacturing method, first, the semiconductor chip including the semiconductor substrate 131 including the plurality of photodiodes PD and transfer transistors 111 arranged in a matrix form, the semiconductor substrate 136 including other circuit elements in the unit pixels 110 and the peripheral circuits, and the on-chip lenses 132 for the respective unit pixels 110 is manufactured through the same process as described in the first embodiment using FIG. 7.

On the other hand, in a process of manufacturing the glass substrate 234, the glass substrate 234 having the trenches 235 formed in the back surface thereof is formed through the same process as described in the second embodiment using FIG. 18.

Next, as illustrated in FIG. 29, a light-shielding film 401A is formed of tungsten (W) or the like on the surface of the glass substrate 234 in which the trenches 235 are formed by using a film deposition technique such as sputtering or chemical vapor deposition (CVD), for example. Here, the light-shielding film 401A is also formed on the sides (i.e., the sides of the partition walls 201) and the bottom surfaces of the trenches 235.

Next, the overall surface of the glass substrate 234 on which the light-shielding film 401A is formed is etched to remove the light-shielding film 401A formed on the bottom surfaces of the trenches 235 and form a light-shielding film 401 on the upper surfaces and the sides of the partition walls 201. Here, the light-shielding film 401 on the upper surfaces of the partition walls 201 may be thinned.

Thereafter, the glass substrate 234 is bonded to the semiconductor substrate 131 using the resin layer 133 and then the lead electrodes 137 and the ball bumps 138 are formed according to the same configuration as described in the first embodiment using FIG. 10 to FIG. 13 to manufacture the image sensor 400 having the cross-sectional structure as illustrated in FIG. 28.

4.2.1 Modified Example of Manufacturing Method

Figure 31:
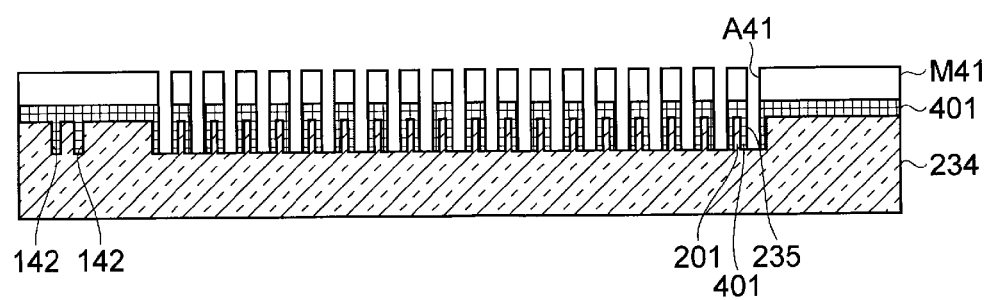
FIG. 31 is a process cross-sectional view showing an example of a cross-sectional structure of an image sensor according to a modified example of the fourth embodiment.

Meanwhile although a case in which the light-shielding film 401A is processed into the light-shielding film 401 through overall etching is exemplified above, the present disclosure is not limited to this technique, and the light-shielding film 401A may be processed into the light-shielding film 401, for example, by forming a mask M41 having an opening shape A41 which is the same as an opening of a cavity of the light-shielding film 401A on the light-shielding film 401A on the upper surfaces and sides of the partition walls 201 and eliminating the light-shielding film 401A on the bottom surfaces of the trenches 235 through reactive ion etching (RIE) or the like in that state, as illustrated in FIG. 31. Meanwhile, the mask M41 can be formed using a technique such as photolithography.

4.3 Operation and Effects

As described above, according to the fourth embodiment, the light-shielding film 301 is provided on the bottom surfaces and the sides of the partition walls 201 at least in the effective pixel area 150. Accordingly, leak of light into neighboring pixels can be further reduced, and thus it is possible to further improve the pixel isolation characteristic of the image sensor 400 to further reduce color mixing. Accordingly, it is possible to further curb picture quality deterioration.

Further, although a case based on the image sensor 300 according to the third embodiment is exemplified in the present embodiment, the embodiment that is a base is not limited to the third embodiment and the base may be other embodiments or modified examples thereof, such as modified examples of the third embodiment and the first or second embodiment.

In addition, other configurations, operations, and effects may be the same as those in the above-described embodiments, and thus detailed description is omitted here.

5. Fifth Embodiment

Next, a solid-state imaging device and an electronic apparatus according to the fifth embodiment will be described in detail with reference to the drawings. Further, in the following description, the same components as those in the above-described embodiment are denoted by the same signs and redundant description is omitted.

In the fifth embodiment, the image sensor 100 is substituted with an image sensor 500 which will be described later in the electronic apparatus 1000 according to the first embodiment. The image sensor 500 has, for example, the same functional configuration as the image sensor 100 described in the first embodiment using FIG. 2 and the like. However, the image sensor 500 has a cross-sectional structure as exemplified in the following description in the present embodiment.

5.1 Example of Cross-Sectional Structure

Figure 32:
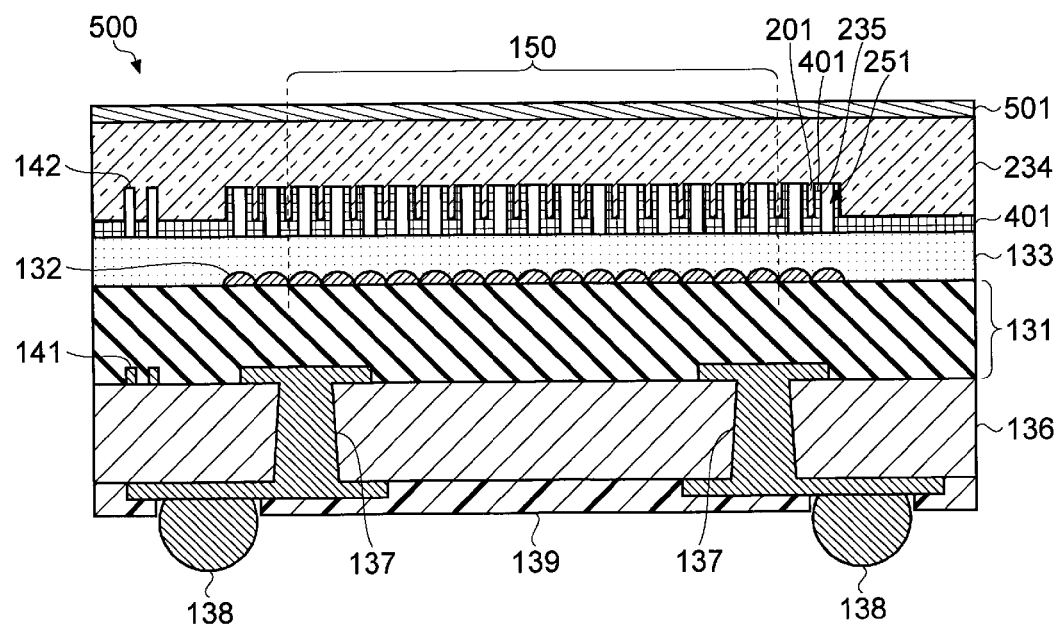
FIG. 32 is a cross-sectional view showing an example of a cross-sectional structure of an image sensor according to a fifth embodiment.

FIG. 32 is a cross-sectional view showing an example of a cross-sectional structure of the image sensor according to the fifth embodiment. Further, although a case in which the image sensor 500 is of the back surface radiation type is exemplified in the present description, it may be of the back surface radiation type or the front surface radiation type as in the first embodiment.

As shown in FIG. 32, the image sensor 500 includes an antireflection film 501 provided on a surface opposite the surface in which the trenches 235 are formed in the glass substrate 234 in the same configuration as the image sensor 400 described in the fourth embodiment using FIG. 28 and the like.

The antireflection film 501 may be, for example, various antireflection films that transmit at least visible light with high efficiency, such as a dielectric multilayer in which a silicon oxide film ($SiO_2$ film) and a titanium nitride film (TiN) are alternately laminated.

By providing the antireflection film 501 on the upper surface of the glass substrate 234 which is a surface of incidence of light in this manner, it is possible to reduce light reflecting from the upper surface of the glass substrate 234 to improve incidence efficiency. Accordingly, the amount of light incident on the photodiode PD of each unit pixel 110 can be increased to improve the contrast, and thus picture quality deterioration can be further curbed.

5.2 Manufacturing Method

Figure 33:
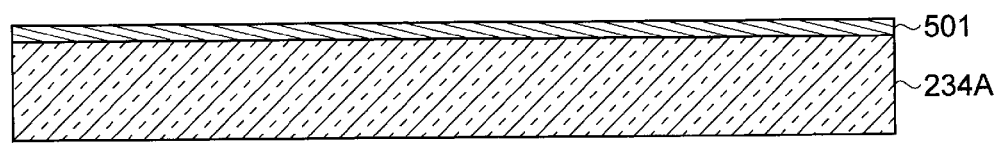
FIG. 33 is a process cross-sectional view showing an example of a method for manufacturing the image sensor according to the fifth embodiment.

Next, a method for manufacturing the image sensor 500 according to the fifth embodiment will be described in detail with reference to the drawings. Further, in the following description, redundant description with respect to the same processes as those in the methods for manufacturing the image sensor 100, 100A, 200, 200D, 300, or 400 according to the above-described embodiments is omitted by referring to the same. FIG. 33 is a process cross-sectional views showing an example of a method for manufacturing the image sensor according to the fifth embodiment.

In the present manufacturing method, first, the semiconductor chip including the semiconductor substrate 131 including the plurality of photodiodes PD and transfer transistors 111 arranged in a matrix form, the semiconductor substrate 136 including other circuit elements in the unit pixels 110 and the peripheral circuits, and the on-chip lenses 132 for the respective unit pixels 110 is manufactured through the same process as described in the first embodiment using FIG. 7.

On the other hand, in a process of manufacturing the glass substrate 234, first, the antireflection film 501 is formed on the upper surface of the glass substrate 234A (the surface opposite the surface in which the trenches 235 are formed), as shown in FIG. 33. To form the antireflection film 501, a general film deposition technique may be used.

Next, the glass substrate 234 having the trenches 235 formed on the back surface thereof is manufactured through the same process as described in the second embodiment using FIG. 18, and subsequently the light-shielding film 401 is formed on the sides (i.e., sides of the partition walls 201) and the bottom surfaces of the trenches 235.

Thereafter, the glass substrate 234 is bonded to the semiconductor substrate 131 using the resin layer 133 and then the lead electrodes 137 and the ball bumps 138 are formed according to the same configuration as described in the first embodiment using FIG. 10 to FIG. 13 to manufacture the image sensor 500 having the cross-sectional structure as illustrated in FIG. 32.

5.3 Operation and Effects

As described above, according to the fifth embodiment, the antireflection film 501 is provided on the upper surface of the glass substrate 234 which is the surface of incidence of light. Accordingly, since light reflecting from the upper surface of the glass substrate 234 can be reduced to improve incidence efficiency, the amount of light incident on the photodiode PD of each unit pixel 110 can be increased to improve the contrast. Accordingly, it is possible to further curb picture quality deterioration.

Further, although a case based on the image sensor 400 according to the fourth embodiment is exemplified in the present embodiment, the embodiment that is a base is not limited to the fourth embodiment and the base may be other embodiments or modified examples thereof, such as modified examples of the fourth embodiment and the first, second, or third embodiment.

In addition, other configurations, operations, and effects may be the same as those in the above-described embodiments, and thus detailed description is omitted here.

6. Sixth Embodiment

Although a case in which the antireflection film 501 formed from a dielectric multilayer or the like is provided on the upper surface of the glass substrate 234 is exemplified in the fifth embodiment, a film disposed on the upper surface of the glass substrate 234 is not limited to the antireflection film 501 and may be modified in various manners.

Accordingly, in the sixth embodiment, a case in which a color filter for cutting off infrared light (hereinafter referred to as an IR cut-off filter) instead of the antireflection film 501 is used as a film disposed on the upper surface of the glass substrate 234 will be described with illustration.

Further, in the following description, the same components as those in the above-described embodiments are denoted by the same signs and redundant description is omitted.

6.1 Example of Cross-Sectional Structure

Figure 34:
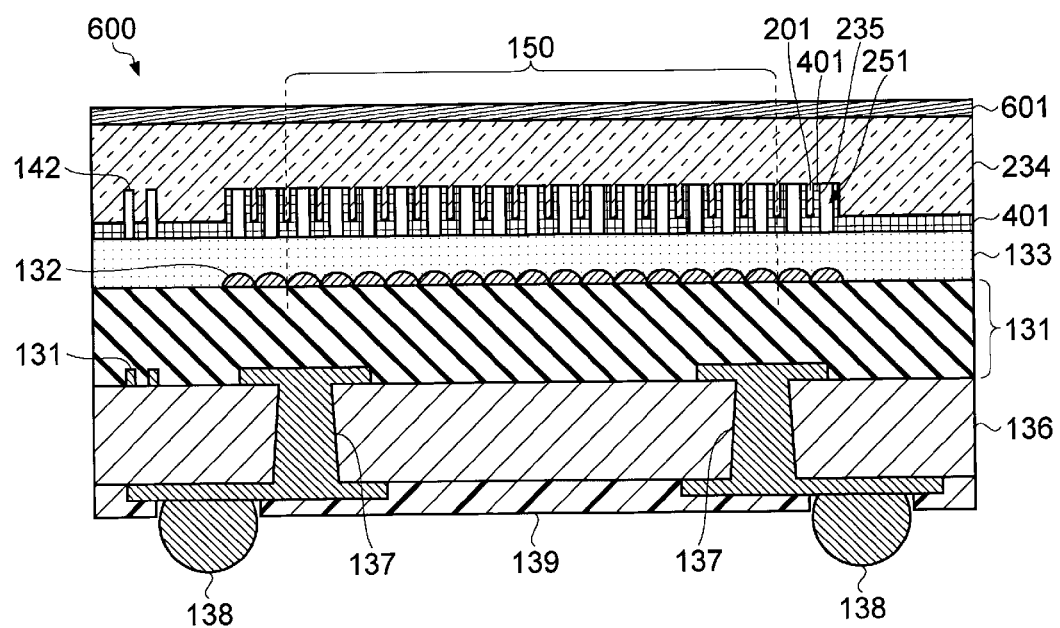
FIG. 34 is a cross-sectional view showing an example of a cross-sectional structure of an image sensor according to a sixth embodiment.

FIG. 34 is a cross-sectional view showing an example of a cross-sectional structure of an image sensor according to the sixth embodiment. Further, although a case in which the image sensor 600 is of the back surface radiation type is exemplified in the present description, it may be of the back surface radiation type or the front surface radiation type as in the first embodiment.

As shown in FIG. 34, the image sensor 600 includes an IR cut-off filter 601 provided on a surface opposite the surface in which the trenches 235 are formed in the glass substrate 234 in the same configuration as the image sensor 400 described in the fourth embodiment using FIG. 28 and the like.

The IR cut-off filter 601 may be, for example, a film formed using a material having a high absorption rate for infrared light or near infrared light.

By providing the IR cut-off filter 601 on the upper surface of the glass substrate 234 which is the surface of incidence of light in this manner, noise caused by incidence of infrared light can be reduced, and thus picture quality deterioration can be further curbed.

6.2 Manufacturing Method

Figure 35:
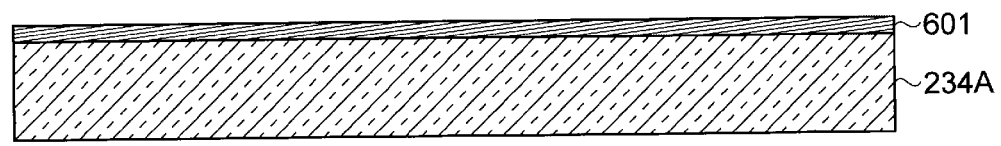
FIG. 35 is a process cross-sectional view showing an example of a method for manufacturing the image sensor according to the sixth embodiment.

Next, a method for manufacturing the image sensor 600 according to the sixth embodiment will be described in detail with reference to the drawings. Further, in the following description, redundant description with respect to the same processes as those in the methods for manufacturing the image sensor 100, 100A, 200, 200D, 300, 400, or 500 according to the above-described embodiments is omitted by referring to the same. FIG. 35 is a process cross-sectional view showing an example of a method for manufacturing the image sensor according to the sixth embodiment.

In the present manufacturing method, first, the semiconductor chip including the semiconductor substrate 131 including the plurality of photodiodes PD and transfer transistors 111 arranged in a matrix form, the semiconductor substrate 136 including other circuit elements in the unit pixels 110 and the peripheral circuits, and the on-chip lenses 132 for the respective unit pixels 110 is manufactured through the same process as described in the first embodiment using FIG. 7.

On the other hand, in a process of manufacturing the glass substrate 234, first, the IR cut-off filter 601 is formed on the upper surface of the glass substrate 234A (the surface opposite the surface in which the trenches 235 are formed), as shown in FIG. 35. To form the IR cut-off filter 601, a general film deposition technique may be used.

Next, the glass substrate 234 having the trenches 235 formed on the back surface thereof is manufactured through the same process as described in the second embodiment using FIG. 18, and subsequently the light-shielding film 401 is formed on the sides (i.e., sides of the partition walls 201) and the bottom surfaces of the trenches 235.

Thereafter, the glass substrate 234 is bonded to the semiconductor substrate 131 using the resin layer 133 and then the lead electrodes 137 and the ball bumps 138 are formed according to the same configuration as described in the first embodiment using FIG. 10 to FIG. 13 to manufacture the image sensor 600 having the cross-sectional structure as illustrated in FIG. 34.

6.3 Operation and Effects

As described above, according to the sixth embodiment, the IR cut-off filter 601 is provided on the upper surface of the glass substrate 234 which is the surface of incidence of light. Accordingly, noise caused by incidence of infrared light can be reduced, and thus picture quality deterioration can be further curbed.

Further, although a case based on the image sensor 400 according to the fourth embodiment is exemplified in the present embodiment, the embodiment that is a base is not limited to the fourth embodiment and the base may be other embodiments or modified examples thereof, such as modified examples of the fourth embodiment and the first, second, third, or fifth embodiment.

In addition, other configurations, operations, and effects may be the same as those in the above-described embodiments, and thus detailed description is omitted here.

7. Seventh Embodiment

Next, a solid-state imaging device and an electronic apparatus according to the seventh embodiment will be described in detail with reference to the drawings. Further, in the following description, the same components as those in the above-described embodiments are denoted by the same signs and redundant description is omitted.

In the above-described embodiments, picture quality deterioration due to occurrence of the flare phenomenon (refer to FIG. 5) caused by reflection from the upper surface of the glass substrate 134 is curbed by disposing the resin layer 133 that is a planarization film on the on-chip lenses 132 and providing a gap (air gap 151) between the resin layer 133 and the glass substrate 134. However, since reflection from the upper surface of the resin layer 133 can still occur in such a configuration, there is a possibility of picture quality deterioration due to occurrence of weak flare phenomenon.

In addition, in a recent image sensor with an increased number of pixels and high picture quality, a chip size has increased due to increase in the number of pixels. Accordingly, to curb occurrence of warping, damage, and the like by improving the rigidity of an image sensor, it is desirable to support an image sensor chip against a glass substrate using a structure such as a partition wall or a pole.

However, if the structure for supporting the image sensor chip is large, light reflected from the structure is incident on a pixel different from a pixel on which the light is supposed to be incident, and thus there is a possibility of picture quality deterioration due to color mixing between pixels.

Accordingly, the present embodiment employs a structure in which an image sensor chip is supported by a plurality of microscopic poles against a glass substrate in a structure in which an air gap is provided between the image sensor chip and the glass substrate. Here, reflection from a resin layer and the like can be removed by employing a structure in which on-chip lenses are not covered with the resin layer and the like, and thus occurrence of the flare phenomenon can be further reduced to curb picture quality deterioration.

In addition, as the microscopic poles supporting the image sensor chip, for example, extremely thin structures in contrast with a pixel size (e.g., the size of a light-receiving surface of each photodiode PD) can be used. By using the extremely thin poles in contrast with the pixel size, reflection from the sides of the poles can be reduced, and thus picture quality deterioration due to color mixing can be curbed.

Further, by providing a plurality of poles for one unit pixel 110 to support the glass substrate, the rigidity of the image sensor can be improved, and thus occurrence of warping, damage, and the like of the image sensor chip on which light-receiving elements, logic circuit, and the like are provided can also be curbed.

Furthermore, since the influence of ununiformity of pole shapes on picture quality is reduced by using poles supporting the image sensor chip as microscopic structures, the accuracy (regularity) of a shape required for the poles is alleviated and thus the poles can be manufactured more easily.

7.1 Example of Cross-Sectional Structure

Figure 36:
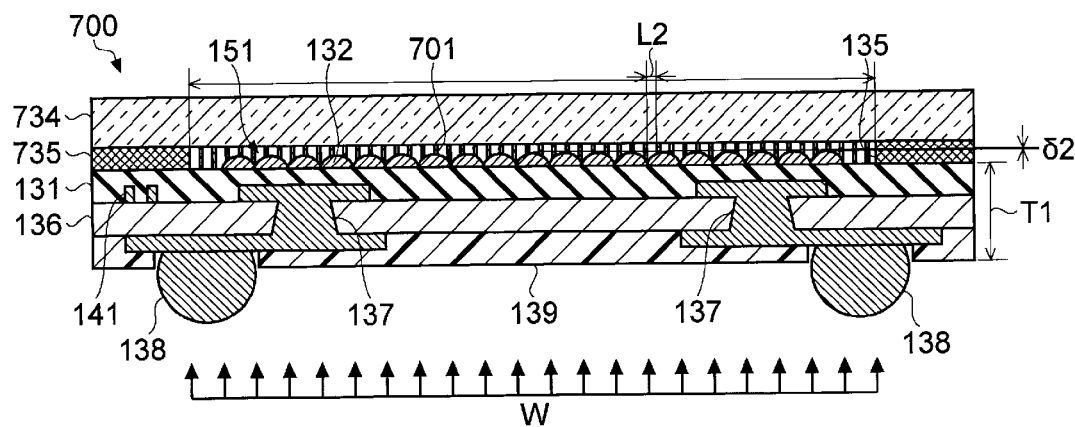
FIG. 36 is a cross-sectional view showing an example of a cross-sectional structure of an image sensor according to a seventh embodiment.
Figure 37:
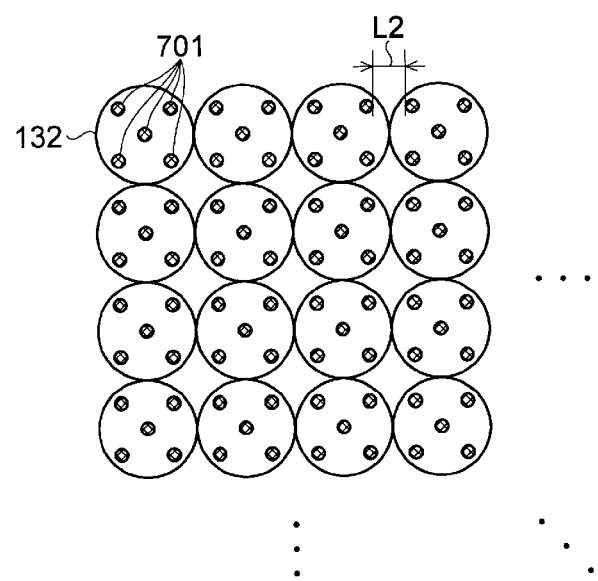
FIG. 37 is a top view showing a positional relationship between on-chip lenses and poles in FIG. 36.

FIG. 36 is a cross-sectional view showing an example of a cross-sectional structure of an image sensor according to the seventh embodiment. FIG. 37 is a top view showing a positional relationship between on-chip lenses and poles in FIG. 36. Further, although a case in which the image sensor 700 is of the back surface radiation type is exemplified in the present description, it may be of the back surface radiation type or the front surface radiation type as in the first embodiment.

As shown in FIG. 36 and FIG. 37, the image sensor 700 has a structure in which a plurality of microscopic poles 701 for supporting the semiconductor substrate 131 (or the on-chip lenses 132) against the glass substrate 134 are provided within the air gap 151 between the semiconductor substrate 131 and the glass substrate 134 in the same configuration as the image sensor 100 described in the first embodiment using FIG. 6 and the like. Meanwhile, although the glass substrate 134 in which the trenches 135 are provided in the first embodiment (refer to FIG. 6), for example, are substituted with a glass substrate 734 that is a transparent parallel plate and seal part 735 provided along the edges of the glass substrate 734 and the semiconductor substrate 131 in FIG. 36, the present embodiment is not limited thereto and may have the same structure as those of the above-described embodiments.

As shown in FIG. 37, in the present embodiment, a plurality of (5 in FIG. 37) poles 701 are disposed for one pixel (e.g., one on-chip lens 132).

The cross-sectional shape of each pole 701 may be a circle (including an ellipse), a polygon with three, four or more sides, or other shapes. In addition, each pole 701 may be a pillar shape in which the cross-sectional width from the upper end to the lower end is approximately uniform, a tapered shape in which the cross-sectional width increases from the upper end to the lower end, or an inverted tapered shape in which the cross-sectional width decreases from the upper end to the lower end. Further, the plurality of poles 701 may be randomly disposed or regularly disposed.

Here, a cross-sectional area (hereinafter referred to as a diameter) and the number (hereinafter referred to as a density) of poles 701 desirable in improvement of the rigidity of the image sensor 700 is described.

Figure 38:
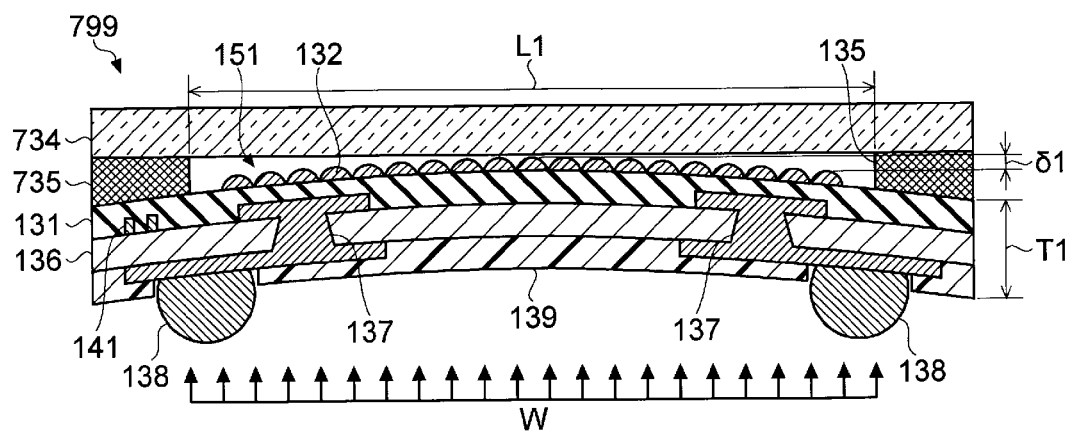
FIG. 38 is a cross-sectional view showing an example of a cross-sectional structure of an image sensor exemplified as a comparative example.

FIG. 38 is a cross-sectional view showing an example of a cross-sectional structure of an image sensor illustrated as a comparative example. In the image sensor 799 shown in FIG. 38, the poles 701 are omitted in the same configuration as that of the image sensor 700 shown in FIG. 36.

In FIG. 38, L1 is the length of the air gap 151, T1 is the substrate thickness of the laminated substrate composed of the semiconductor substrates 131 and 136, δ1 is a displacement amount of the laminated substrate in the substrate thickness direction, and W is a stress applied to the laminated substrate.

The displacement amount δ1 varies by the fourth power of the length L1 of the air gap 151 in the calculation formula for a fixed-end beam, represented by the following formula (1), for example. Accordingly, if the length L1 is doubled, the displacement amount δ1 increases 16 times and positions of photodiodes PD between pixels considerably change, and thus optical effects increase and picture quality deteriorates. In addition, since the displacement amount δ1 increases, there is also a possibility that the semiconductor substrates 131 and 136 are damaged and thus a damage such as a crack is generated. Further, in formula (1), E is Young's modulus and I is cross-section secondary moment.

[Math. 1]

$$\delta 1 = \frac{W \times L1^4}{384 \times E \times I} \quad (1)$$

Meanwhile, it is possible to reduce the displacement amount δ2 of the laminated substrate while providing the air gap 151 for preventing flare between the unit pixels 110 and the glass substrate 734 by providing the plurality of microscopic poles 701 on the on-chip lens 132 of each unit pixel 110 as in the present embodiment.

For example, when five poles 701 are disposed per pixel as shown in FIG. 37 in the image sensor 700 in which the length L1 of the air gap 151 is 10 mm (millimeters) and a pixel pitch (a distance between unit pixels 110) is 1.5 μm (micrometers), a distance L2 between poles 701 can be set to 0.5 μm, for example. In this case, a displacement amount δ2 of the laminated substrate in the image sensor 700 with respect to the displacement amount δ1 of the laminated substrate in the image sensor 799 is δ2/δ1=0.5$^4$/10000$^4$=6.25×10$^{-18}$, which is a negligibly small value, according to the aforementioned formula (1).

In addition, a flare phenomenon caused by reflection of light from the sides of the poles 701 can be sufficiently reduced as compared to a case in which the partition walls 201 are used as in the second embodiment, for example, because each pole 701 is a microscopic structure.

Figure 39:
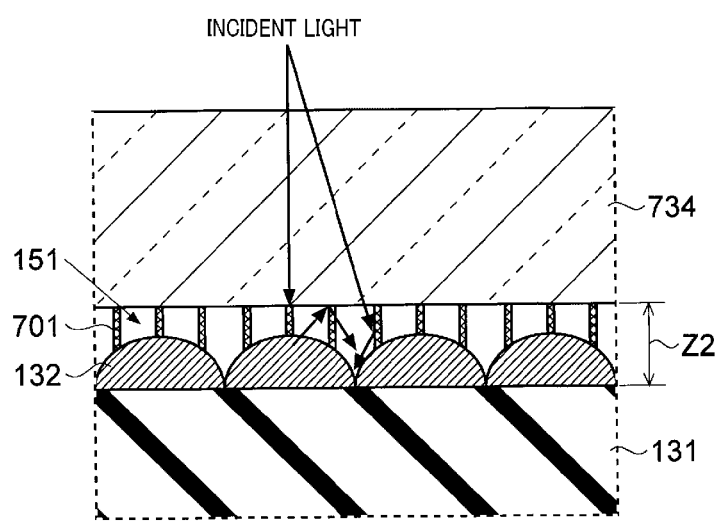
FIG. 39 is an enlarged view showing an example of a partial cross-sectional structure of the image sensor according to the seventh embodiment.

In addition, it is possible to fix an incidence destination of reflected light reduced by the microscopic poles 701 to a pixel on which the light is supposed to be incident, neighboring pixels thereof, or the like by decreasing the distance Z2 from the semiconductor substrate 131 to the glass substrate 734, for example, to be shorter than the dimension of one pixel (e.g., the size of each unit pixel 110 or each photodiode PD in an element formation surface direction) (e.g., 1 μm or less), as shown in FIG. 39, and thus an influence of color mixing can be restrained to further curb picture quality deterioration.

Meanwhile, the diameter of the pole 701 may be determined on the basis of strengths with respect to compression and tension of a material used therefor. For example, for a stress W of 1 to 3 MPa (megapascal), a tensile strength of about 45 to 70 MPa is obtained for each pole 701 with respect to compression and tension when the poles 701 are formed of a resin material such as an acrylic resin. For example, when stress W=3 MPa and tensile strength σ per unit area=50 MPa, a ratio of the area of poles 701 to the area of each unit pixel 110 becomes W/σ=3/50, and thus the area of the poles 701 can be reduced to about 0.06.

Accordingly, when the pixel size is set to 1.5 μm and five poles 701 per pixel (refer to FIG. 38) are provided, the diameter of each pole 701 can be set to 0.18 μm. Since the size of the pole 701 can be set to about 1/10 of the pixel size of 1.5 μm in this manner, a rate of reflection from the sides of the poles 701 can be drastically reduced.

In addition, since the size of the pole 701 is considerably less than the size of the unit pixel 110, optical effects are reduced for a slight position shift or variation in the shape of the pole 701. On the other hand, if the diameter and pitch of the poles 701 are secured to a certain degree, the accuracy of a process of forming the poles 701 can be decreased because the strength of supporting the image sensor chip against the glass substrate 734 can be maintained, and thus it is possible to relatively easily manufacture the poles 701 and the image sensor 700.

7.2 Manufacturing Method

Figure 40:
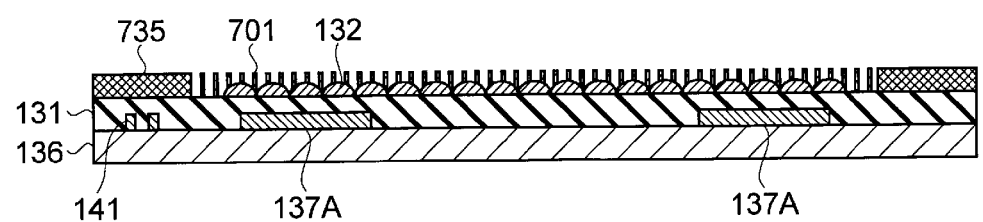
FIG. 40 is a process cross-sectional view showing an example of a method for manufacturing the image sensor according to the seventh embodiment (1).
Figure 41:
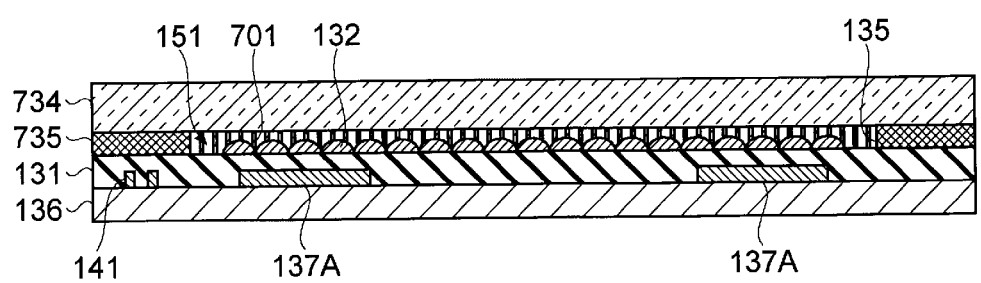
FIG. 41 is a process cross-sectional view showing an example of the method for manufacturing the image sensor according to the seventh embodiment (2).

Next, a method for manufacturing the image sensor 700 according to the seventh embodiment will be described in detail with reference to the drawings. Further, in the following description, redundant description with respect to the same processes as those in the methods for manufacturing the image sensor according to the above-described embodiments is omitted by referring to the same. FIG. 40 and FIG. 41 are process cross-sectional views showing an example of a method for manufacturing the image sensor according to the seventh embodiment.

In the present manufacturing method, first, the semiconductor chip including the semiconductor substrate 131 including the plurality of photodiodes PD and the transfer transistors 111 arranged in a matrix form, the semiconductor substrate 136 including other circuit elements in the unit pixels 110 and the peripheral circuits, and the on-chip lenses 132 for the respective unit pixels 110 is manufactured through the same process as described in the first embodiment using FIG. 7.

Next, in the present embodiment, a photosensitive transparent resin is coated on the semiconductor substrate 131 on which the on-chip lenses 132 are provided, for example, using spin coating. Subsequently, as shown in FIG. 40, the formed resin layer is semi-cured by transferring patterns of the poles 701 and the seal part 735 to the resin layer to form the poles 701 and the seal part 735.

Next, the glass substrate 734 is mounted on the semi-cured poles 701 and seal part 735 and the glass substrate 734 is heated in a state in which the glass substrate 734 is pressed against the poles 701 and the seal part 735, to attach the glass substrate 734 to the poles 701 and the seal part 735, as shown in FIG. 41.

Thereafter, the lead electrodes 137 and the ball bumps 138 are formed according to the same configuration as described in the first embodiment using FIG. 11 to FIG. 13, to manufacture the image sensor 700 having the cross-sectional structure as illustrated in FIG. 36.

7.3 Operation and Effects

As described above, in the present embodiment, the image sensor chip is supported by the plurality of microscopic poles 701 against the glass substrate 734 in the structure in which the air gap is provided between the image sensor chip and the glass substrate 734. Here, by employing the structure in which the on-chip lenses 132 are not covered with a resin layer or the like, reflection from the resin layer or the like can be removed, and thus it is possible to reduce occurrence of the flare phenomenon to curb picture quality deterioration.

In addition, since considerably thin structures as compared to the pixel size are used as the microscopic poles 701 supporting the image sensor chip, reflection from the sides of the poles 701 is reduced, and thus picture quality deterioration due to color mixing can be curbed.

Further, since the rigidity of the image sensor 700 is improved by supporting the glass substrate using a plurality of poles 701 provided for one unit pixel 110, it is also possible to curb occurrence of warping, damage, and the like of the image sensor chip in which light-receiving elements, logic circuits, and the like are provided.

Moreover, since an influence of ununiformity of the pole shape on the picture quality is reduced by forming the poles 701 supporting the image sensor chip as microscopic structures, the accuracy (regularity) of the shape required for the poles is alleviated, and thus it is possible to more easily manufacture the poles.

Furthermore, since a distance Z from the vertex of the on-chip lens 132 to the glass substrate 734 can be reduced (e.g., 1 μm or less) by forming the poles 701 as microscopic structures, an influence of color mixing caused by light reflected from the sides of the poles 701 can be further reduced.

Meanwhile, a total of cross-sectional areas (cross-sectional areas in a plane perpendicular to the substrate thickness direction) of the poles 701 can be determined on the basis of a ratio of an expected stress W to compressive and tensile strength σ of the material used for the poles 701. For example, when a stress applied to the laminated substrate (131 and 136) is W, the tensile strength of the poles 701 is σ, and the area of the air gap 151 between the laminated substrate (131 and 136) and the glass substrate 734 is AR, the diameter of each pole 701 may be determined such that a total area (((diameter of pole)²/4×π)×number of poles) PR of the cross-sectional areas of the poles 701 satisfies the following formula (2).

$$PR > AR \times W/\sigma \tag{2}$$

Further, to prevent the stress W propagated through the poles 701 from concentrating on a part of the semiconductor substrates 131 and 136, for example, it is advantageous to increase the number of poles 701 and to thoroughly distribute the poles 701 in the pixel array 101.

Other configurations, operations, and effects may be the same as those in the above-described embodiments, and thus detailed description is omitted here.

8. Eighth Embodiment

Next, a solid-state imaging device and an electronic apparatus according to the eighth embodiment will be described in detail with reference to the drawings. Further, in the following description, the same components as those in the above-described embodiments are denoted by the same signs and redundant description is omitted.

In the above-described seventh embodiment, a structure in which countless microscopic poles 701 which are randomly or regularly arranged support the image sensor chip against the glass substrate 734 has been exemplified. On the other hand, in the eighth embodiment, a structure in which the number of poles 701 can be further reduced is described with illustration.

8.1 Example of Cross-Sectional Structure

Figure 42:
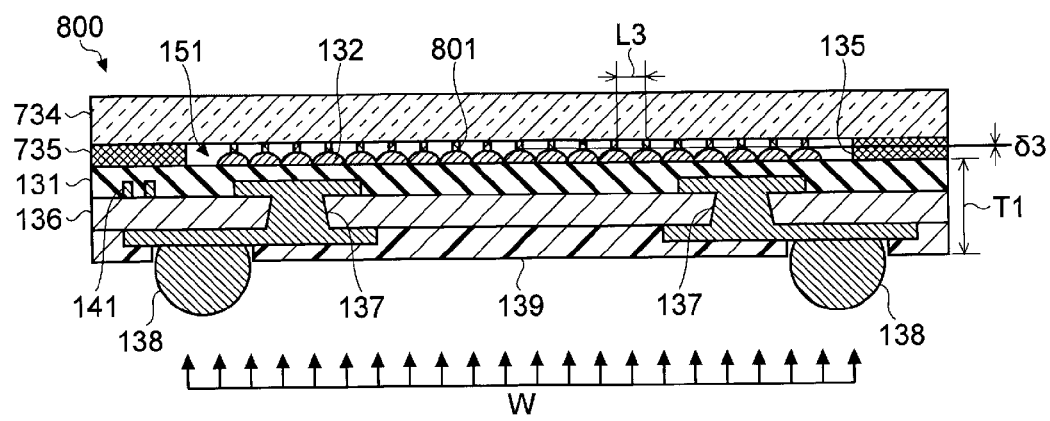
FIG. 42 is a cross-sectional view showing an example of a cross-sectional structure of an image sensor according to an eighth embodiment.
Figure 43:
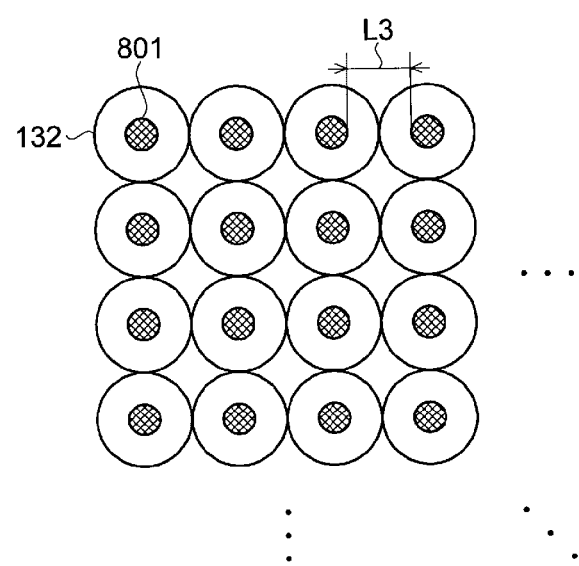
FIG. 43 is a top view showing a positional relationship between on-chip lenses and poles in FIG. 42.

FIG. 42 is a cross-sectional view showing an example of a cross-sectional structure of an image sensor according to the eighth embodiment. FIG. 43 is a top view showing a positional relationship between on-chip lenses and poles in FIG. 42. Further, although a case in which the image sensor 800 is of the back surface radiation type is exemplified in the present description, it may be of the back surface radiation type or the front surface radiation type as in the first embodiment.

As shown in FIG. 42 and FIG. 43, the image sensor 800 has a structure in which a plurality of microscopic poles 701 provided per unit pixel 110 in the same configuration as the image sensor 700 described in the seventh embodiment using FIG. 36 and the like are substituted with a plurality of microscopic poles 801 respectively provided for the unit pixels 110.

As shown in FIG. 43, each pole 801 may be disposed at the vertex of each on-chip lens 132. In addition, the cross-sectional shape of each pole 801 may be modified in various manners, such as a circle and a polygon, like the poles 701. Further, each pole 701 may be modified in various manners, such as a columnar shape, a tapered shape, and an inverted tapered shape, like the poles 701.

Figure 44:
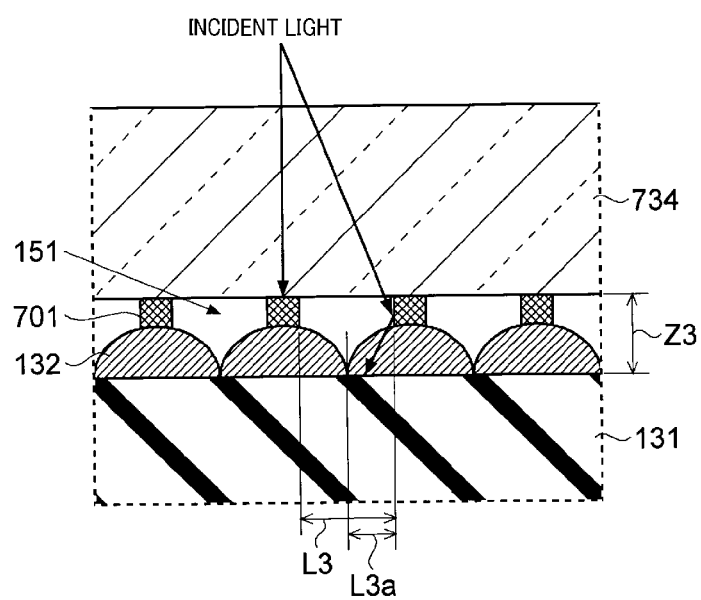
FIG. 44 is an enlarged view showing an example of a partial cross-sectional structure of the image sensor according to the eighth embodiment.

When one pole 801 is disposed for one unit pixel 110 in this manner, it is possible to increase a distance L3a from the side of each pole 801 to a neighboring unit pixel 110 by disposing each pole 801 at the vertex of each on-chip lens 132, as shown in FIG. 44. Accordingly, a proportion of incidence of light reflected from the side of each pole 801 on a neighboring pixel can be further reduced, and thus it is possible to further restrain color mixing to further curb picture quality deterioration.

In addition, when a distance L3 between poles 801 is 1.5 μm, a ratio of δ3/δ1 becomes $1.5^4/10000^4 = 5.06 \times 10^{-16}$ which is a very small value according to the aforementioned formula (1), and thus the displacement amount δ3 becomes a negligibly small value.

Figure 45:
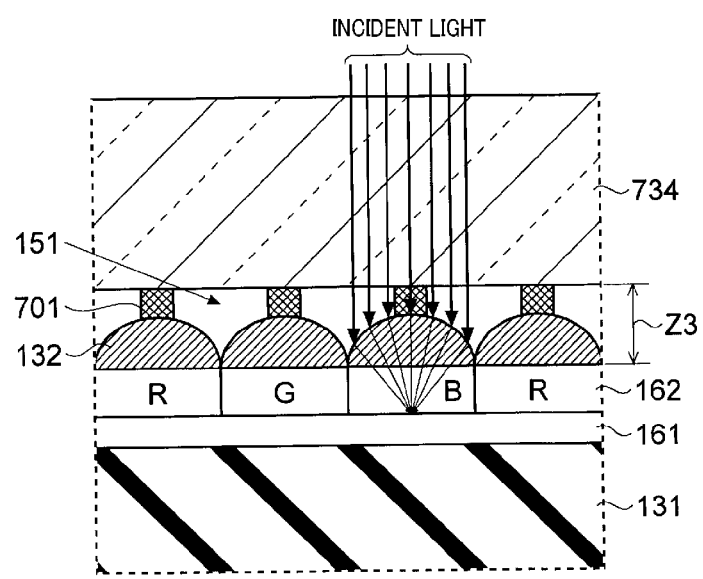
FIG. 45 is an enlarged view showing an example of another partial cross-sectional structure of the image sensor according to the eighth embodiment.

Further, when stress W=3 MPa, tensile strength σ=50 MPa, and the pixel size is 1.5 μm, for example, a diameter required for the pole 801 is 0.42 μm which is about 30% of the pixel size, but an influence on concentration of incident light is conceived to be negligibly small in each unit pixel 110 because light incident on the center of each unit pixel 110 is approximately straightly incident on the light-receiving surface of the unit pixel 110 through the pole 801, as shown in FIG. 45. Meanwhile, in FIG. 45, a planarization film 161 and a color filter 162 on the semiconductor substrate 131 are illustrated without being omitted for convenience of description, the planarization film 161 and the color filter 162 may be disposed on the semiconductor substrate 131 in the same manner in the cross-sectional structures of the image sensors described using other drawings.

Further, in the case of pupil correction, positions of the poles 801 with respect to the on-chip lenses 132 may be shifted from the vertexes of the on-chip lenses 132 in response to an image height.

3.2 Operation and Effects

As described above, according to the present embodiment, by providing one pole 801 for one unit pixel 110 to support the glass substrate, the rigidity of the image sensor 800 is improved, and thus occurrence of warping, damage, and the like of the image sensor chip on which light-receiving elements, logic circuit, and the like are provided can be curbed.

In addition, an influence on neighboring pixels can also be reduced for a light incidence angle of an imaging lens with a short focal distance by disposing the poles 801 near the vertexes of the on-chip lenses 132.

Other configurations, operations, manufacturing methods, and effects may be the same as those in the above-described embodiments, and thus detailed description is omitted here.

9. Ninth Embodiment

Next, a solid-state imaging device and an electronic apparatus according to the ninth embodiment will be described in detail with reference to the drawings.

Further, in the following description, the same components as those in the above-described embodiments are denoted by the same signs and redundant description is omitted.

In the above-described eighth embodiment, a case in which the number of disposed poles 801 is reduced by disposing one pole 801 for one unit pixel 110 has been exemplified. On the other hand, in the ninth embodiment, a structure in which the number of poles 801 can be further reduced is described with illustration.

9.1 Example of Cross-Sectional Structure

Figure 46:
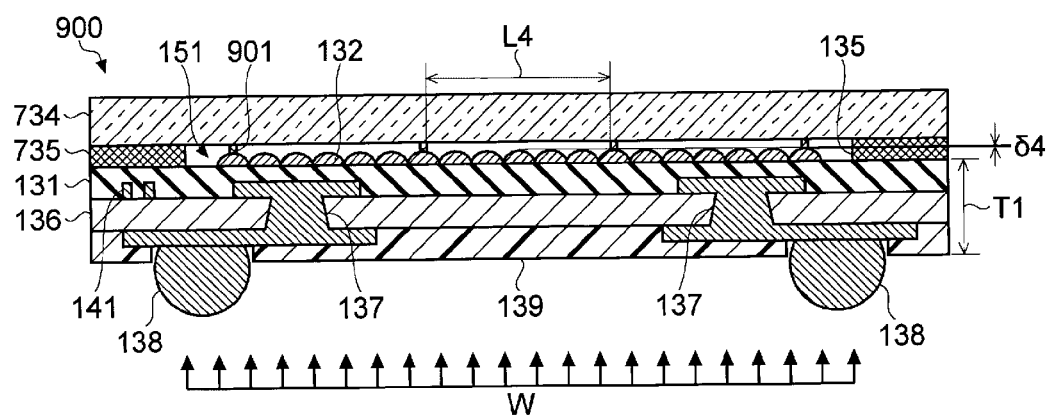
FIG. 46 is a cross-sectional view showing an example of a cross-sectional structure of an image sensor according to a ninth embodiment.
Figure 47:
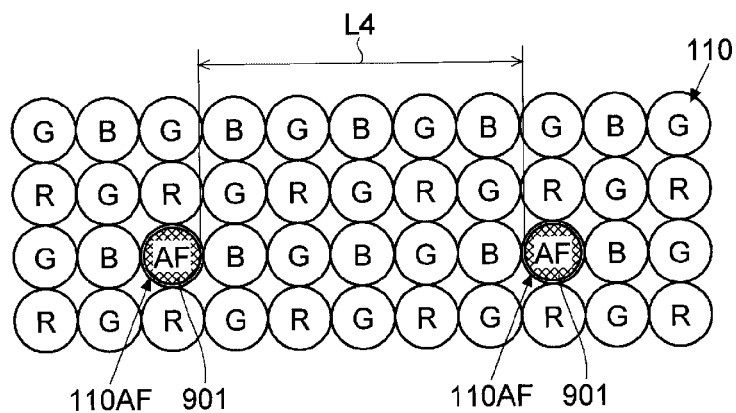
FIG. 47 is a top view showing a positional relationship between on-chip lenses and poles in FIG. 46.

FIG. 46 is a cross-sectional view showing an example of a cross-sectional structure of an image sensor according to the ninth embodiment. FIG. 47 is a top view showing a positional relationship between on-chip lenses and poles in FIG. 46. Further, although a case in which the image sensor 900 is of the back surface radiation type is exemplified in the present description, it may be of the back surface radiation type or the front surface radiation type as in the first embodiment.

As shown in FIG. 46 and FIG. 47, the image sensor 900 has a structure in which the microscopic poles 801 respectively provided for unit pixels 110 in the same configuration as the image sensor 800 described in the eighth embodiment using FIG. 42 and the like are substituted with poles 901 provided in some unit pixels 110AF among a plurality of unit pixels 110 arranged in an array form.

As shown in FIG. 47, for example, the poles 901 may be disposed in respective unit pixels 110AF for image surface phase difference type auto-focus (AF) which are distributed and arranged at regular intervals in the pixel array 101, for example.

These unit pixels 110AF for AF may be unit pixels that are not used to generate image data, that is, that are not read targets when image data is generated, or unit pixels that are read targets when the focus of the image sensor 900 is automatically controlled (AF). In this case, pixel values of omitted pixels (pixels corresponding to the unit pixels 110AF) in image data output from the image sensor 900 may be interpolated through pixel interpolation based on pixel values of peripheral pixels, for example.

By disposing the poles 901 for the unit pixels 110AF for AF symmetrically arranged in this manner, an influence on image data output from the image sensor 900 can be reduced or avoided. In addition, since the number of unit pixels 110 affected by light reflected from the sides of the poles 901 can be reduced by decreasing the number of poles 901, picture quality deterioration can be further curbed.

Each pole 901 may be disposed at the vertex of each on-chip lens 132 like the poles 801. In addition, the cross-sectional shape of each pole 901 may be modified in various manner, such as a circle and a polygon, like the poles 801. Further, each pole 901 may be modified in various manners, such as a columnar shape, a tapered shape, and an inverted tapered shape, like the poles 801.

Here, when the pixel size is 1.5 μm, and the unit pixels 110AF for AF are disposed having five unit pixels 110 interposed therebetween, a ratio of $\delta 4/\delta 1$ becomes $(1.5\times 4)^4/10000^4 = 1.296\times 10^{-13}$ which is a very small value according to the aforementioned formula (1), and thus the displacement amount $\delta 4$ becomes a negligibly small value.

In addition, when stress W=3 MPa and tensile strength σ=50 MPa, for example, a ratio W/σ of an area required for the poles 901 to the area of the unit pixels 110AF becomes 3/50. In this case, it is possible to secure the strength of the image sensor chip by disposing three unit pixels 110AF (i.e., three poles 901) for 50 unit pixels 110.

9.2 Operation and Effects

As described above, in the present embodiment, the number of unit pixels 110 affected by light reflected from the sides of the poles 901 can be reduced because the poles 901 are provided for unit pixels 110AF for AF which are not used to generate image data. Accordingly, it is possible to further curb picture quality deterioration.

Other configurations, operations, manufacturing methods, and effects may be the same as those in the above-described embodiments, and thus detailed description is omitted here.

10. Modified Examples of Seventh to Ninth Embodiments

Figure 48:
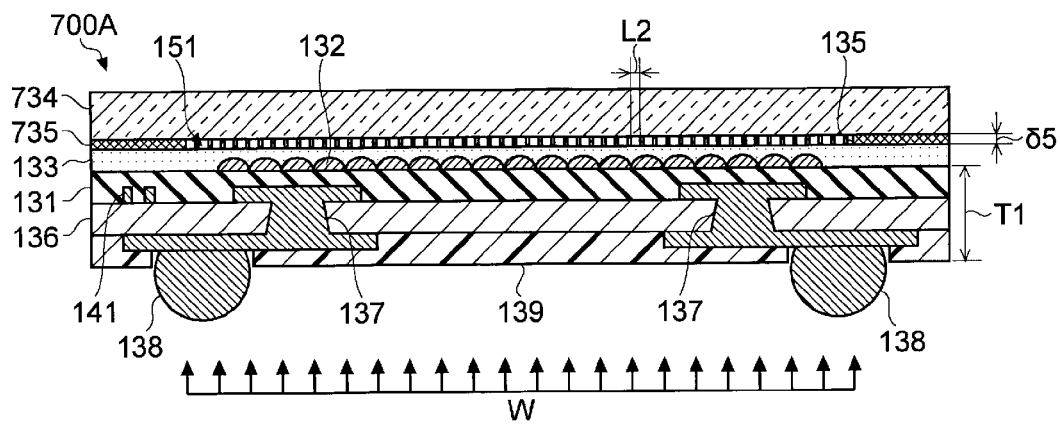
FIG. 48 is a cross-sectional view showing an example of a cross-sectional structure of an image sensor according to a modified example of the seventh to ninth embodiments.

Meanwhile, although a case in which the on-chip lenses 132 are not covered with a resin layer has been exemplified in the above-described seventh embodiment, the present disclosure is not limited thereto and may employ, for example, a structure in which the on-chip lenses 132 are covered with the resin layer 133 and the seal part 735, the poles 701, and the glass substrate 734 are laminated thereon as in an image sensor 700A illustrated in FIG. 48. However, FIG. 48 shows a modified example based on the image sensor 700 according to the seventh embodiment, the structure can be applied to other embodiments in the same manner.

Figure 49:
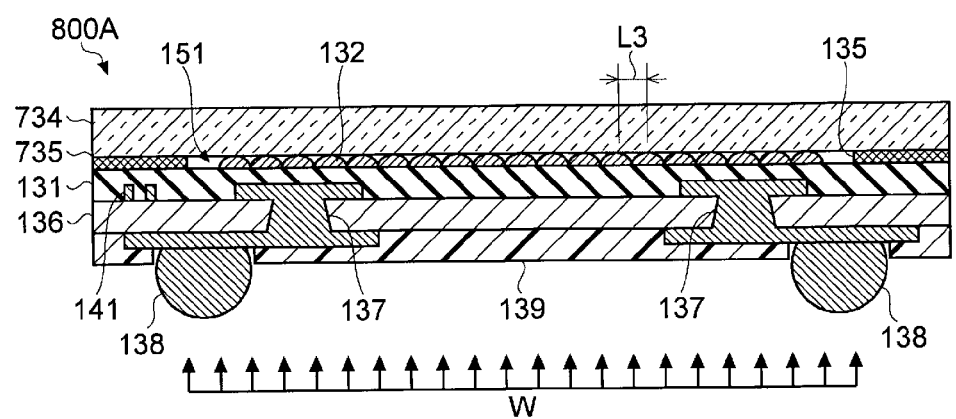
FIG. 49 is a cross-sectional view showing an example of a cross-sectional structure of an image sensor according to another modified example of the seventh to ninth embodiments.

In addition, a structure in which the glass substrate 734 is directly supported by the on-chip lenses 132 as in an image sensor 800A illustrated in FIG. 49 may be employed. In this case, it is possible to further curb picture quality deterioration due to color mixing because, for example, the poles 801 in the eighth embodiment are omitted and thus there is no reflection from the sides of the poles 801.

11. Application Example 1 for Moving Object

The technology according to the present disclosure (the present technology) can be applied to various products. For example, the technology according to the present disclosure may be realized as an apparatus to be mounted in any of various types of moving objects including an automobile, an electric vehicle, a hybrid electric vehicle, a motorcycle, a bicycle, personal mobility, an airplane, a drone, an ocean vessel, and a robot.

Figure 50:
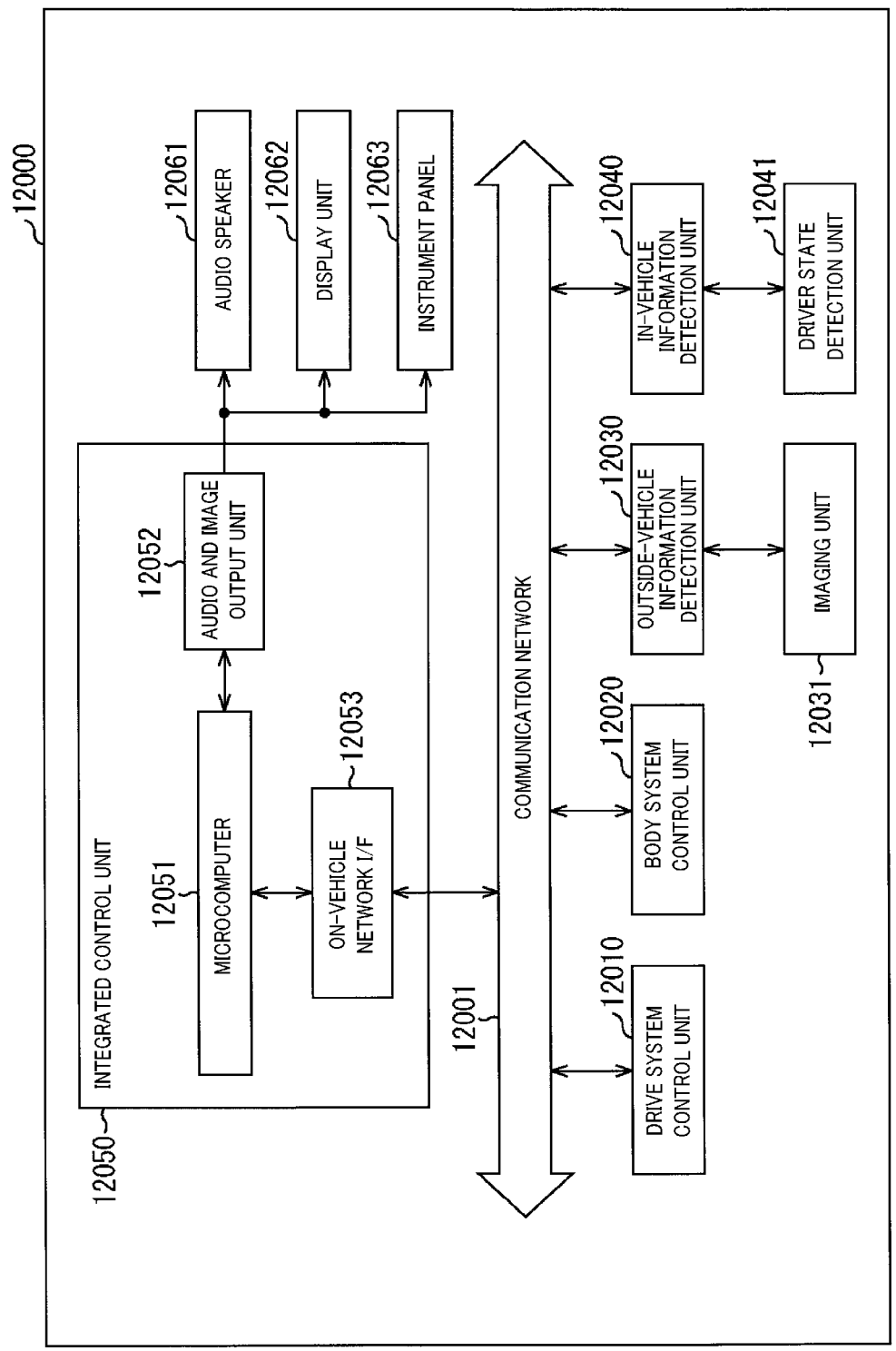
FIG. 50 is a block diagram showing an example of a schematic configuration of a vehicle control system.

FIG. 50 is a block diagram showing a schematic configuration example of a vehicle control system that is an example of a moving object control system to which the technology according to the present disclosure can be applied.

The vehicle control system 12000 includes a plurality of electronic control units connected via a communication network 12001. In the example shown in FIG. 50, the vehicle control system 12000 includes a drive system control unit 12010, a body system control unit 12020, an outside-vehicle information detection unit 12030, an in-vehicle information detection unit 12040, and an integrated control unit 12050. Further, as functional components of the integrated control unit 12050, a microcomputer 12051, an audio and image output unit 12052, and an on-vehicle network I/F (Interface) 12053 are illustrated.

The drive system control unit 12010 controls operations of devices related to a drive system of a vehicle according to various programs. For example, the drive system control unit 12010 serves as a control device of a driving force generation device for generating a driving force of a vehicle, such as an internal combustion engine or a driving motor, a driving force transmission mechanism for transmitting the driving force to wheels, a steering mechanism for adjusting a steering angle of the vehicle, a braking device that generates a braking force of the vehicle, and the like.

The body system control unit 12020 controls operations of various devices mounted in a vehicle body according to various programs. For example, the body system control unit 12020 serves as a control device of a keyless entry system, a smart key system, a power window device, various lamps such as a head lamp, a back lamp, a brake lamp, a turn signal, and a fog lamp, or the like. In this case, radio waves or signals of various switches transmitted from a portable device with which keys are replaced may be input to the body system control unit 12020. The body system control unit 12020 receives an input of the radio waves or signals and controls a door lock device, a power window device, lamps, and the like of the vehicle.

The outside-vehicle information detection unit 12030 detects information on the outside of the vehicle in which the vehicle control system 12000 is mounted. For example, an imaging unit 12031 is connected to the outside-vehicle information detection unit 12030. The outside-vehicle information detection unit 12030 causes the imaging unit 12031 to capture an image of a vehicle exterior and receives a captured image. The outside-vehicle information detection unit 12030 may perform an object detection process or a distance detection process for people, vehicles, obstacles, signs, or characters on a road surface, or the like on the basis of the received image.

The imaging unit 12031 is an optical sensor that receives light and outputs an electrical signal according to an amount of received light. The imaging unit 12031 can output the electrical signal as an image or as distance measurement information. The light received by the imaging unit 12031 may be visible light or invisible light such as infrared light.

The in-vehicle information detection unit 12040 detects in-vehicle information. A driver state detection unit 12041 that detects a state of a driver, for example, is connected to the in-vehicle information detection unit 12040. The driver state detection unit 12041 includes, for example, a camera that images the driver, and the in-vehicle information detection unit 12040 may calculate a degree of fatigue or a degree of concentration of the driver on the basis of the detection information input from the driver state detection unit 12041 or may determine whether or not the driver is asleep.

The microcomputer 12051 can calculate a control target value of the driving force generation device, the steering mechanism, or the braking device on the basis of the information on the inside or the outside of the vehicle acquired by the outside-vehicle information detection unit 12030 or the in-vehicle information detection unit 12040, and output a control command to the drive system control unit 12010. For example, the microcomputer 12051 can perform cooperative control aiming at realizing functions of advanced driver assistance system (ADAS) including vehicle collision avoidance or impact mitigation, follow-up traveling based on an inter-vehicle distance, vehicle speed maintenance traveling, vehicle collision warning, vehicle lane deviation warning, and the like.

Further, the microcomputer 12051 can control the driving force generation device, the steering mechanism, the braking device, or the like on the basis of information on the vicinity of the vehicle acquired by the outside-vehicle information detection unit 12030 or the in-vehicle information detection unit 12040 to perform cooperative control aiming at autonomous driving in which the vehicle autonomously travels without depending on an operation of the driver.

Furthermore, on the basis of information on the exterior of the vehicle acquired by the outside-vehicle information detection unit 12030, the microcomputer 12051 can output a control command to the body system control unit 12020. For example, the microcomputer 12051 can control a headlamp according to a position of a preceding vehicle or an oncoming vehicle detected by the outside-vehicle information detection unit 12030 to perform cooperative control aiming at achieving antiglare such as switching from a high beam to a low beam.

The audio and image output unit 12052 transmits an output signal of at least one of an audio and an image to an output device capable of visually or audibly notifying a passenger of the vehicle or the outside of information. In the example of FIG. 50, an audio speaker 12061, a display unit 12062, and an instrument panel 12063 are exemplified as the output device. The display unit 12062 may include, for example, at least one of an onboard display and a head-up display.

Figure 51:
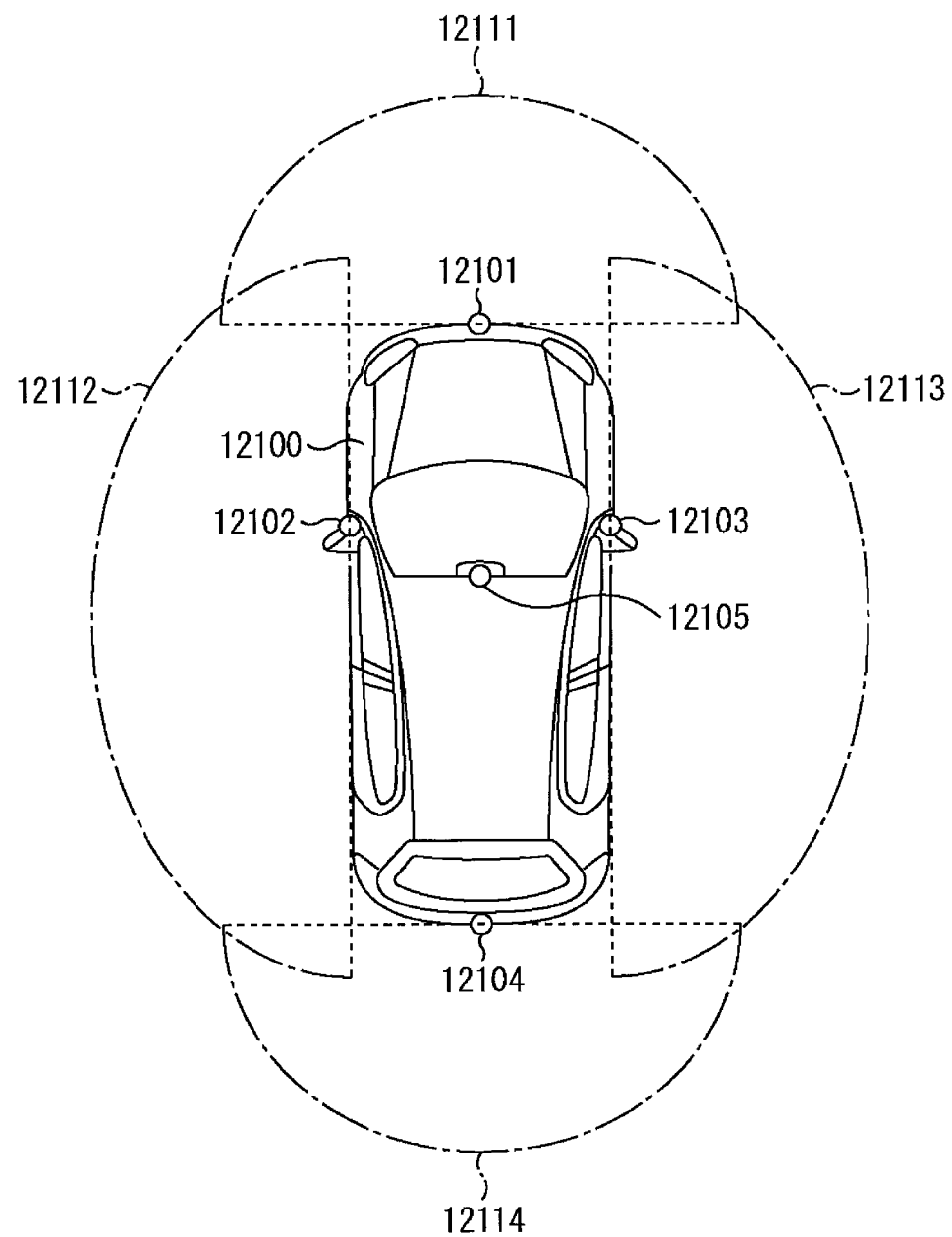
FIG. 51 is an explanatory diagram showing an example of an installation position of an outside-vehicle information detection unit and an imaging unit.

FIG. 51 is a diagram showing an example of installation positions of the imaging unit 12031.

In FIG. 51, the imaging unit 12031 includes imaging units 12101, 12102, 12103, 12104, and 12105.

The imaging units 12101, 12102, 12103, 12104, and 12105 are provided at positions such as a front nose, side mirrors, a rear bumper, a back door, and an upper portion of a windshield in a vehicle interior of the vehicle 12100. The imaging unit 12101 included in the front nose and the imaging unit 12105 included in the upper portion of the windshield in the vehicle interior mainly acquire an image of a region in front of the vehicle 12100. The imaging units 12102 and 12103 provided in the side mirrors mainly acquire images of lateral sides of the vehicle 12100. The imaging unit 12104 provided on the rear bumper or the back door mainly acquires an image behind the vehicle 12100. The imaging unit 12105 provided on the upper portion of the windshield in the vehicle interior is mainly used for detecting a preceding vehicle, a pedestrian, an obstacle, a traffic signal, a traffic sign, a lane, or the like.

FIG. 51 shows an example of imaging ranges of the imaging units 12101 to 12104. An imaging range 12111 indicates an imaging range of the imaging unit 12101 provided in the front nose, imaging ranges 12112 and 12113 indicate imaging ranges of the imaging units 12102 and 12103 provided in the respective side mirrors, and an imaging range 12114 indicates an imaging range of the imaging unit 12104 provided in the rear bumper or the back door. For example, by image data captured by the imaging units 12101 to 12104 being superimposed, a bird's-eye view image of the vehicle 12100 viewed from above can be obtained.

At least one of the imaging units 12101 to 12104 may have a function of acquiring distance information. For example, at least one of the imaging units 12101 to 12104 may be a stereo camera including a plurality of imaging elements or may be an imaging element having pixels for phase difference detection.

For example, the microcomputer 12051 can obtain a distance to each three-dimensional object within the imaging ranges 12111 to 12114 and a change of the distance over time (a relative speed with respect to the vehicle 12100) on the basis of distance information obtained from the imaging units 12101 to 12104 and extract a three-dimensional object which is especially the closest three-dimensional object on a road on which the vehicle 12100 travels and is traveling in substantially the same direction as the vehicle 12100 at a predetermined speed (for example, 0 km/h or more) as a preceding vehicle. Further, the microcomputer 12051 can set an inter-vehicle distance to be secured in front of the preceding vehicle in advance, and perform automatic brake control (including follow-up stop control), automatic acceleration control (including follow-up start control), and the like. Thus, it is possible to perform cooperative control aiming at autonomous driving in which the vehicle autonomously travels without depending on an operation of the driver.

For example, the microcomputer 12051 can classify three-dimensional object data regarding three-dimensional objects into other three-dimensional objects such as a two-wheeled vehicle, an ordinary vehicle, a large vehicle, a pedestrian, and a utility pole on the basis of distance information obtained from the imaging units 12101 to 12104, extract the objects, and use the objects for automatic avoidance of obstacles. For example, the microcomputer 12051 identifies obstacles around the vehicle 12100 as an obstacle visible to the driver of the vehicle 12100 and an obstacle difficult for the driver of the vehicle 12100 to view. Then, the microcomputer 12051 can determine a collision risk indicating a degree of risk of collision with each obstacle, and can output a warning to driver through the audio speaker 12061 or the display unit 12062 or perform forced deceleration or avoidance steering through the drive system control unit 12010 to perform driving assistance for collision avoidance when the collision risk is equal to or greater than a set value and there is a possibility of collision.

At least one of the imaging units 12101 to 12104 may be an infrared camera that detects infrared light. For example, the microcomputer 12051 can recognize a pedestrian by determining whether or not a pedestrian is present in images captured by the imaging units 12101 to 12104. Such recognition of the pedestrian is performed by, for example, a procedure for extracting feature points in the images captured by the imaging units 12101 to 12104 that are infrared cameras and a procedure for performing pattern matching processing on a series of feature points indicating a contour of an object to determine whether it is a pedestrian. When the microcomputer 12051 determines that a pedestrian is present in the images captured by the imaging units 12101 to 12104 and recognizes the pedestrian, the audio and image output unit 12052 controls the display unit 12062 to superimpose and display a rectangular contour line for emphasis on the recognized pedestrian. Further, the audio and image output unit 12052 may control the display unit 12062 to display an icon indicating a pedestrian or the like at a desired position.

An example of the vehicle control system to which the technology according to the present disclosure can be applied has been described above. The technique according to the present disclosure may be applied to the imaging unit 12031 and the like among the components described above. By applying the technology according to the present disclosure to the imaging unit 12031, fatigue of a driver can be reduced since a clearer captured image can be obtained.

12. Application Example for Endoscopic Operation System

The technology according to the present disclosure (the present technology) can be applied to various products. For example, the technology according to the present disclosure may be applied to an endoscopic operation system.

Figure 52:
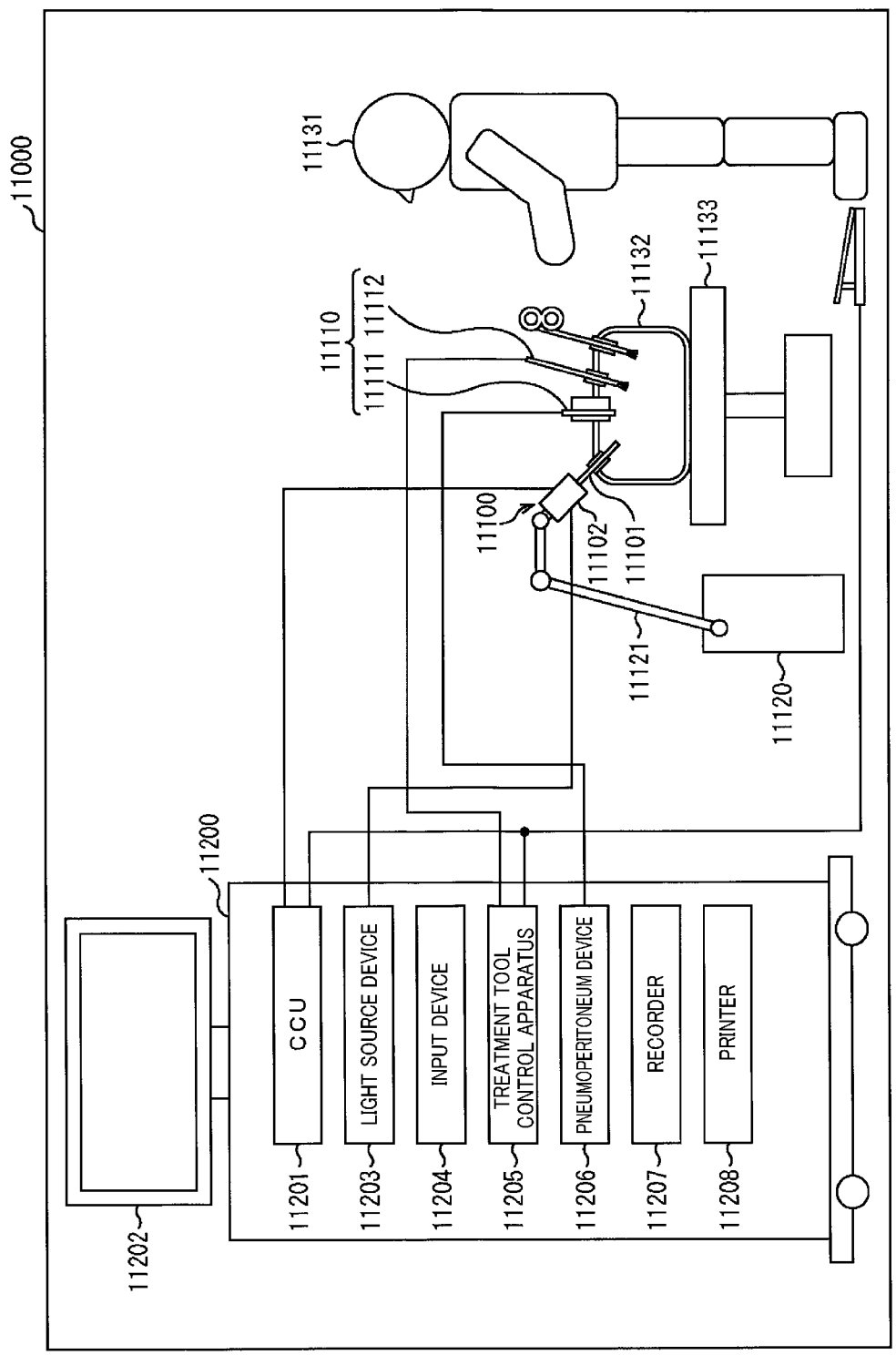
FIG. 52 is a diagram showing an example of a schematic configuration of an endoscopic operation system.

FIG. 52 is a diagram showing an example of a schematic configuration of an endoscopic operation system to which the technology according to the present disclosure (the present technology) can be applied.

FIG. 52 illustrates a state in which an operator (doctor) 11131 is performing an operation on a patient 11132 on a patient bed 11133 using the endoscopic operation system 11000. As illustrated, the endoscopic operation system 11000 includes an endoscope 11100, other operation tools 11110 such as a pneumoperitoneum tube 11111 and an energy treatment instrument 11112, a support arm apparatus 11120 for supporting the endoscope 11100, and a cart 11200 mounted with various apparatuses for an endoscopic operation.

The endoscope 11100 includes a lens barrel 11101 of which a region having a predetermined length from a distal end is inserted into a body cavity of the patient 11132, and a camera head 11102 connected to a base end of the lens barrel 11101. Although the endoscope 11100 configured as a so-called rigid mirror having the rigid lens barrel 11101 is illustrated in the illustrated example, the endoscope 11100 may be configured as a so-called flexible mirror having a flexible lens barrel.

An opening in which an objective lens is fitted is provided at a distal end of the lens barrel 11101. A light source device 11203 is connected to the endoscope 11100, and light generated by the light source device 11203 is guided to the distal end of the lens barrel by a light guide extending inside the lens barrel 11101 and is radiated toward an observation target in the body cavity of the patient 11132 via the objective lens. The endoscope 11100 may be a direct-viewing endoscope or may be a perspective endoscope or a side-viewing endoscope.

An optical system and an imaging element are provided inside the camera head 11102, and reflected light (observation light) from the observation target is concentrated on the imaging element by the optical system. The observation light is photoelectrically converted by the imaging element, and an electrical signal corresponding to the observation light, that is, an image signal corresponding to an observation image is generated. The image signal is transmitted as RAW data to a camera control unit (CCU) 11201.

The CCU 11201 includes, for example, a central processing unit (CPU) and a graphics processing unit (GPU), and generally controls operations of the endoscope 11100 and the display device 11202. Further, the CCU 11201 receives an image signal from the camera head 11102, and performs, on the image signal, various types of image processing such as development processing (demosaic processing), for example, for displaying an image based on the image signal.

The display device 11202 displays an image based on the image signal subjected to the image processing by the CCU 11201 under the control of the CCU 11201.

The light source device 11203 includes, for example, a light source such as a light emitting diode (LED) and supplies the endoscope 11100 with irradiation light for imaging an operation site or the like.

An input device 11204 is an input interface for the endoscopic operation system 11000. A user can input various types of information or instructions to the endoscopic operation system 11000 via the input device 11204. For example, the user inputs an instruction to change imaging conditions (a type of irradiation light, a magnification, a focal distance, and the like) of the endoscope 11100.

A treatment tool control apparatus 11205 controls driving of the energy treatment instrument 11112 for cauterizing or incising tissue, sealing a blood vessel, or the like. A pneumoperitoneum device 11206 sends a gas into the body cavity of the patient 11132 through the pneumoperitoneum tube 11111 in order to inflate the body cavity of the patient 11132 for the purpose of securing a visual field and a working space of the operator using the endoscope 11100. A recorder 11207 is a device capable of recording various pieces of information regarding an operation. A printer 11208 is a device capable of printing various types of information on an operation in various formats such as text, images, or graphs.

The light source device 11203 that supplies the endoscope 11100 with the irradiation light for imaging the operation site can be configured as, for example, an LED, a laser light source, or a white light source configured as a combination thereof. When a white light source is formed by a combination of RGB laser light sources, it is possible to control an output intensity and an output timing of each color (each wavelength) with high accuracy and thus, the light source device 11203 can adjust white balance of the captured image. Further, in this case, the observation target is time-divisionally irradiated with laser light from the respective RGB laser light sources, and driving of the imaging element of the camera head 11102 is controlled in synchronization with the irradiation timing, such that images corresponding to respective RGB can be captured in a time division manner. According to this method, it is possible to obtain a color image without providing a color filter to the imaging element.

Further, the driving of the light source device 11203 may be controlled to change the intensity of the output light at predetermined time intervals. It is possible to acquire images in a time-division manner by controlling the driving of the imaging element of the camera head 11102 in synchronization with a timing at which the intensity of the light is changed, and it is possible to generate a high dynamic range image without so-called blackout and whiteout by combining the images.

Further, the light source device 11203 may be configured to be able to supply light in a predetermined wavelength band corresponding to special light observation. In the special light observation, for example, a so-called narrow band light observation (narrow band imaging) in which a body tissue is irradiated with light in a narrower band than irradiation light (that is, white light) in normal observation using wavelength dependence of absorption of light in the body tissue, so that a predetermined tissue such as a blood vessel on a mucosal surface layer is imaged with high contrast is performed. Alternatively, in the special light observation, fluorescence observation in which an image is obtained using fluorescence generated by radiating excitation light may be performed. In the fluorescence observation, it is possible to irradiate the body tissue with excitation light and observe the fluorescence from the body tissue (autofluorescence observation) or obtain a fluorescence image by locally injecting a reagent such as indocyanine green (ICG) into the body tissue and irradiating the body tissue with excitation light corresponding to the fluorescence wavelength of the reagent, or the like. The light source device 11203 may be configured to be able to supply the narrow band light and/or the excitation light corresponding to such special light observation.

Figure 53:
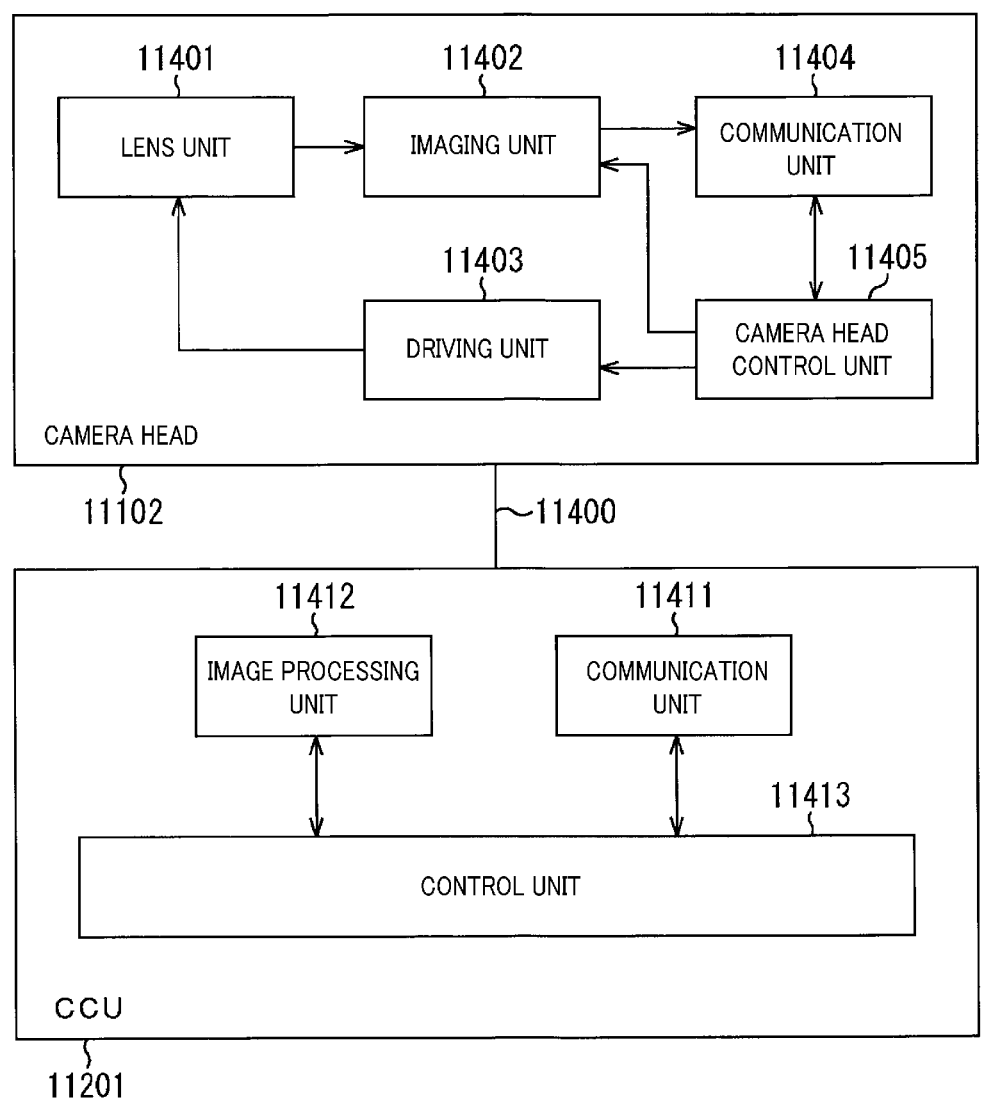
FIG. 53 is a block diagram showing an example of a functional configuration of a camera head and a CCU.

FIG. 53 is a block diagram showing an example of a functional configuration of the camera head 11102 and CCU 11201 shown in FIG. 52.

The camera head 11102 includes a lens unit 11401, an imaging unit 11402, a driving unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other via a transmission cable 11400.

The lens unit 11401 is an optical system provided at a portion for connection to the lens barrel 11101. Observation light taken in from the distal end of the lens barrel 11101 is guided to the camera head 11102 and incident on the lens unit 11401. The lens unit 11401 is configured as a combination of a plurality of lenses including a zoom lens and a focus lens.

The number of imaging elements constituting the imaging unit 11402 may be one (so-called single-plate type) or plural (so-called multi-plate type). When the imaging unit 11402 is configured as a multi-plate type, image signals corresponding to R, G, and B, for example, may be generated by the respective imaging elements and may be combined to obtain a color image. Alternatively, the imaging unit 11402 may be configured to include a pair of imaging elements for respectively acquiring right-eye image signals and left-eye image signals corresponding to 3D (dimensional) display. By performing the 3D display, the operator 11131 can ascertain a depth of a living tissue in the operation site more accurately. Also, in a case in which the imaging unit 11402 is configured as the multi-plate type, a plurality of lens units 11401 may be provided corresponding to each imaging element.

Further, the imaging unit 11402 may not be provided in the camera head 11102. For example, the imaging unit 11402 may be provided inside the lens barrel 11101 immediately behind the objective lens.

The driving unit 11403 includes an actuator, and moves the zoom lens and the focus lens of the lens unit 11401 by a predetermined distance along an optical axis under the control of the camera head control unit 11405. Accordingly, the magnification and focus of the image captured by the imaging unit 11402 can be adjusted appropriately.

The communication unit 11404 is configured as a communication device for transmitting or receiving various types of information to or from the CCU 11201. The communication unit 11404 transmits an image signal obtained from the imaging unit 11402 as RAW data to the CCU 11201 via the transmission cable 11400.

In addition, the communication unit 11404 receives a control signal for controlling the driving of the camera head 11102 from the CCU 11201 and supplies the control signal to the camera head control unit 11405. The control signal includes, for example, information on imaging conditions such as information indicating that a frame rate of a captured image is designated, information indicating that an exposure value at the time of imaging is designated, and/or information indicating that the magnification and a focus of the captured image are designated.

Further, the imaging conditions such as the frame rate, the exposure value, the magnification, and the focus may be appropriately designated by the user, or may be automatically set by the control unit 11413 of the CCU 11201 on the basis of the acquired image signal. In the latter case, a so-called auto exposure (AE) function, auto focus (AF) function, and auto white balance (AWB) function are provided in the endoscope 11100.

The camera head control unit 11405 controls the driving of the camera head 11102 on the basis of a control signal from the CCU 11201 received via the communication unit 11404.

The communication unit 11411 is configured as a communication device for transmitting and receiving various types of information to and from the camera head 11102. The communication unit 11411 receives an image signal transmitted from the camera head 11102 via the transmission cable 11400.

Further, the communication unit 11411 transmits a control signal for controlling the driving of the camera head 11102 to the camera head 11102. The image signal or the control signal can be transmitted through electric communication, optical communication, or the like.

The image processing unit 11412 performs various types image processing on the image signal that is the RAW data transmitted from the camera head 11102.

The control unit 11413 performs various controls regarding imaging of the operation site or the like using the endoscope 11100 and display of a captured image obtained by imaging the operation site or the like. For example, the control unit 11413 generates a control signal for controlling the driving of the camera head 11102.

Further, the control unit 11413 causes the display device 11202 to display the captured image obtained by imaging the operation site or the like on the basis of the image signal subjected to the image processing by the image processing unit 11412. In this case, the control unit 11413 may recognize various objects in the captured image using various image recognition technologies. For example, the control unit 11413 can detect shapes, colors, and the like of edges of an object included in the captured image, thereby recognizing operation instruments such as forceps, a specific living body part, bleeding, mist at the time of using the energy treatment instrument 11112, and the like. The control unit 11413 may use the recognition results to superimpose and display various types of operation support information on the image of the operation site when the captured image is displayed on the display device 11202. By displaying the operation support information in a superimposed manner and presenting it to the operator 11131, a burden on the operator 11131 can be reduced, and the operator 11131 can reliably proceed with the operation.

The transmission cable 11400 that connects the camera head 11102 to the CCU 11201 is an electrical signal cable compatible with communication of an electrical signal, an optical fiber compatible with optical communication, or a composite cable thereof.

Here, in the illustrated example, wired communication is performed using the transmission cable 11400, but communication between the camera head 11102 and the CCU 11201 may be performed wirelessly.

An example of the endoscopic operation system to which the technology according to the present disclosure can be applied has been described above. The technology according to the present disclosure can be applied to, for example, the imaging unit 11402 of the camera head 11102 in the configuration described above. By applying the technology according to the present disclosure to the camera head 11102, it is possible to obtain a clearer image of the operation site and thus, the operator can reliably confirm the operation site.

Meanwhile, although the endoscopic operation system has been described as an example, the technology according to the present disclosure may be applied to, for example, a microscopic operation system and the like.

Although the embodiments of the present disclosure have been described above, the technical scope of the present disclosure is not limited to the above-described embodiments as it is and can be modified in various manners without departing from the spirit or scope of the present disclosure. In addition, components of different embodiments and modified examples may be appropriately combined.

The effects in each embodiment described in the present description are merely illustrative and not restrictive, and other effects may be obtained.

Further, the present technology may also be configured as below.

(1) A solid-state imaging device including:
  a semiconductor substrate including a light-receiving element;
  an on-chip lens disposed on a first surface of the semiconductor substrate;
  a resin layer covering the on-chip lens; and
  a glass substrate disposed on the side of the first surface of the semiconductor substrate separately from the resin layer.

(2) The solid-state imaging device according to (1), further including a structure in a wall shape which supports the glass substrate against the semiconductor substrate.

(3) The solid-state imaging device according to (2), wherein
  the semiconductor substrate includes a plurality of the light-receiving elements disposed in a matrix form on the side of the first surface of the semiconductor substrate, and
  the structure is disposed at a boundary part of the neighboring light-receiving elements.

(4) The solid-state imaging device according to (2) or (3), wherein
  the glass substrate includes a first trench in a surface facing the semiconductor substrate, and
  the structure divides the first trench into a plurality of second trenches.

(5) The solid-state imaging device according to (4), wherein the structure is a partition wall that is a part of the glass substrate and divides the first trench into the plurality of second trenches.

(6) The solid-state imaging device according to (4) or (5), wherein
  the on-chip lens corresponds one-to-one to each of the light-receiving elements, and the structure divides the first trench into the plurality of second trenches such that each of the second trenches corresponds one-to-one to the on-chip lenses.

(7) The solid-state imaging device according to (4) or (5), wherein
  the on-chip lens corresponds one-to-one to each of the light-receiving elements, and the structure divides the first trench into the plurality of second trenches such that each of the second trenches corresponds one-to-one to each of a plurality of the on-chip lenses.

(8) The solid-state imaging device according to (4) or (5), wherein a depth of the first trench is equal to or greater than 1 μm (micrometer) and is a depth equal to or less than half a maximum thickness of the glass substrate.

(9) The solid-state imaging device according to any one of (2) to (7), further including a first light-shielding film provided on a surface of the structure on the side of the semiconductor substrate.

(10) The solid-state imaging device according to (9), further including a second light-shielding film provided on the side of the structure.

(11) The solid-state imaging device according to any one of (1) to (10), further including an antireflection film provided on a surface opposite the surface facing the semiconductor substrate in the glass substrate.

(12) The solid-state imaging device according to any one of (1) to (10), further including a filter that is provided on the surface opposite the surface facing the semiconductor substrate in the glass substrate and absorbs infrared light.

(13) The solid-state imaging device according to any one of (1) to (12), wherein a roughness of the surface of the glass substrate which faces the semiconductor substrate is higher than a roughness of the surface opposite the surface of the semiconductor substrate in the glass substrate.

(14) The solid-state imaging device according to (4) or (5), wherein the resin layer rises toward the inside of each of the second trenches.

(15) The solid-state imaging device according to (4) or (5), wherein a cross-sectional shape of a surface of the second trenches which is parallel to the first surface is a rectangle.

(16) The solid-state imaging device according to (4) or (5), wherein a cross-sectional shape of a surface of the second trenches which is parallel to the first surface is a circle.

(17) A solid-state imaging device including:
  a semiconductor substrate including a light-receiving element;
  an on-chip lens disposed on a first surface of the semiconductor substrate;
  a glass substrate disposed on the side of the first surface of the semiconductor substrate separately from the on-chip lens; and
  a pillar-shaped structure supporting the glass substrate against the semiconductor substrate.

(18) The solid-state imaging device according to (17), wherein
the semiconductor substrate includes a plurality of the light-receiving elements, and a plurality of the pillar-shaped structures are provided for one of the light-receiving elements.

(19) The solid-state imaging device according to (18), wherein the pillar-shaped structure is randomly or regularly disposed for each of the light-receiving elements.

(20) The solid-state imaging device according to (17), wherein
the semiconductor substrate includes the plurality of light-receiving elements, and the pillar-shaped structures are provided to correspond one-to-one to one of the light-receiving elements.

(21) The solid-state imaging device according to (20), wherein the pillar-shaped structure is disposed at a vertex of the on-chip lens.

(22) The solid-state imaging device according to (17), wherein
the semiconductor substrate includes the plurality of light-receiving elements, and the pillar-shaped structure is provided for some of the plurality of light-receiving elements.

(23) The solid-state imaging device according to (22), wherein the some light-receiving elements are light-receiving elements of pixels used for image surface phase difference type auto-focus adjustment.

(24) The solid-state imaging device according to any one of (17) to (23), wherein
when a stress applied to the semiconductor substrate is W, a tensile strength of the pillar-shaped structure is σ, and an area of a gap between the semiconductor substrate and the glass substrate is AR, a total area PR of a cross section of the pillar-shaped structure which is parallel to the first surface satisfies the following formula (3).

$$PR > AR \times W/\sigma \quad (3)$$

(25) The solid-state imaging device according to any one of (17) to (24), wherein a height of the pillar-shaped structure from the first surface of the semiconductor substrate is less than a size of the light-receiving element in a direction of the first surface.

(26) An electronic apparatus including:
a solid-state imaging device;
an optical system that images incident light on a light-receiving surface of the solid-state imaging device; and
a processor that controls the solid-state imaging device, wherein
the solid-state imaging device includes:
a semiconductor substrate including a light-receiving element;
an on-chip lens disposed on a first surface of the semiconductor substrate;
a resin layer covering the on-chip lens; and
a glass substrate disposed on the side of the first surface of the semiconductor substrate separately from the resin layer.

(27) An electronic apparatus including:
a solid-state imaging device;
an optical system that images incident light on a light-receiving surface of the solid-state imaging device; and
a processor that controls the solid-state imaging device, wherein
the solid-state imaging device includes:
a semiconductor substrate including a light-receiving element;
an on-chip lens disposed on a first surface of the semiconductor substrate;
a glass substrate disposed on the side of the first surface of the semiconductor substrate separately from the on-chip lens; and
a pillar-shaped structure supporting the glass substrate against the semiconductor substrate.

REFERENCE SIGNS LIST 100, 100A, 200, 200D, 300, 400, 500, 600, 700, 700A, 800, 800A, 900 Solid-state imaging device (image sensor)
101 Pixel array
102 Vertical driving circuit
103 Column processing circuit
104 Horizontal driving circuit
105 System control unit
108 Signal processing unit
109 Data storage unit
110 Unit pixel
111 Transfer transistor
112 Reset transistor
113 Amplification transistor
114 Select transistor
121 Light-receiving chip
122 Circuit chip
131, 136 Semiconductor substrate
132 On-chip lens
133, 133A, 233 Resin layer
134, 134A, 234, 234A, 234B, 234C, 734 Glass substrate
135, 235, 235A, 235b Trench
137 Lead electrode
137A Electrode pad
138 Ball bump
139 Passivation
141, 142 Alignment mark
143 Bottom surface
150 Effective pixel area
151, 251, 251A Air gap
201, 201A, 201D Partition wall
201a Row partition wall
201b Column partition wall
202 Upper surface
211, 212 Boundary part
301, 301A, 401, 401A Light-shielding film
501 Antireflection film
601 IR cut-off filter
701, 801, 901 Pole
735 Seal part
1000 Electronic apparatus
1020 Imaging lens
1030 Storage unit
1040 Processor
FD Floating diffusion layer
LD Pixel drive line
LD111 Transfer transistor drive line
LD112 Reset transistor drive line
LD114 Select transistor drive line
PD Photodiode
VSL Vertical signal line

The invention claimed is:
1. A solid-state imaging device, comprising:
a semiconductor substrate including a light-receiving element;
an on-chip lens disposed on a first surface of the semiconductor substrate;

a resin layer that covers the on-chip lens; and
a glass substrate disposed on a side of the first surface of the semiconductor substrate separately from the resin layer, wherein the glass substrate includes a first trench in a surface that faces the semiconductor substrate.

2. The solid-state imaging device according to claim 1, further comprising a structure in a wall shape which supports the glass substrate against the semiconductor substrate.

3. The solid-state imaging device according to claim 2, wherein:
the semiconductor substrate further includes a plurality of light-receiving elements, including the light-receiving element, disposed in a matrix form on the side of the first surface of the semiconductor substrate, and
the structure is disposed at a boundary part of neighboring light-receiving elements of the plurality of light-receiving elements.

4. The solid-state imaging device according to claim 3, wherein the structure divides the first trench into a plurality of second trenches.

5. The solid-state imaging device according to claim 4, wherein the structure is a partition wall that is a part of the glass substrate and divides the first trench into the plurality of second trenches.

6. The solid-state imaging device according to claim 4, wherein:
the on-chip lens corresponds one-to-one to each of the plurality of light-receiving elements, and
the structure divides the first trench into the plurality of second trenches such that each of the plurality of second trenches corresponds one-to-one to the on-chip lens.

7. The solid-state imaging device according to claim 4, wherein:
the on-chip lens corresponds one-to-one to each of the plurality of light-receiving elements,
the structure divides the first trench into the plurality of second trenches such that each of the plurality of second trenches corresponds one-to-one to each of a plurality of on-chip lenses that includes the on-chip lens.

8. The solid-state imaging device according to claim 4, wherein a depth of the first trench is equal to or greater than 1 µm (micrometer) and is a depth equal to or less than half a maximum thickness of the glass substrate.

9. The solid-state imaging device according to claim 4, wherein the resin layer rises toward an inside of each of the plurality of second trenches.

10. The solid-state imaging device according to claim 4, wherein a cross-sectional shape of a surface of the plurality of second trenches which is parallel to the first surface is a rectangle.

11. The solid-state imaging device according to claim 4, wherein a cross-sectional shape of a surface of the plurality of second trenches which is parallel to the first surface is a circle.

12. The solid-state imaging device according to claim 2, further comprising a first light-shielding film provided on a surface of the structure on the side of the semiconductor substrate.

13. The solid-state imaging device according to claim 12, further comprising a second light-shielding film provided on a side of the structure.

14. The solid-state imaging device according to claim 1, further comprising an antireflection film provided on a surface, of the glass substrate, opposite to the surface that faces the semiconductor substrate.

15. The solid-state imaging device according to claim 1, further comprising a filter that is provided on a surface, of the glass substrate, opposite to the surface that faces the semiconductor substrate, wherein the filter absorbs infrared light.

16. The solid-state imaging device according to claim 1, wherein a roughness of the surface of the glass substrate which faces the semiconductor substrate is higher than a roughness of a surface, of the glass substrate, opposite to the first surface of the semiconductor substrate.

17. A solid-state imaging device, comprising:
a semiconductor substrate including a plurality of light-receiving elements;
an on-chip lens disposed on a first surface of the semiconductor substrate;
a glass substrate disposed on a side of the first surface of the semiconductor substrate separately from the on-chip lens; and
a plurality of pillar-shaped structures for one of the plurality of light-receiving elements, wherein the plurality of pillar-shaped structures supports the glass substrate against the semiconductor substrate.

18. The solid-state imaging device according to claim 17, wherein each of the plurality of pillar-shaped structures is provided to correspond one-to-one to one of the plurality of light-receiving elements.

19. An electronic apparatus, comprising:
a solid-state imaging device;
an optical system configured to image incident light on a light-receiving surface of the solid-state imaging device; and
a processor configured to control the solid-state imaging device, wherein the solid-state imaging device includes:
a semiconductor substrate including a light-receiving element;
an on-chip lens disposed on a first surface of the semiconductor substrate;
a resin layer that covers the on-chip lens;
a glass substrate disposed on a side of the first surface of the semiconductor substrate separately from the resin layer;
a structure in a wall shape that supports the glass substrate against the semiconductor substrate; and
a light-shielding film on a surface, of the structure, that is on the side of the semiconductor substrate.

* * * * *